(12) United States Patent
Himmelfarb et al.

(10) Patent No.: US 10,317,449 B2
(45) Date of Patent: Jun. 11, 2019

(54) SYSTEM AND METHOD FOR MEASURING WIDEBAND NOISE PARAMETERS USING AN IMPEDANCE GENERATOR

(71) Applicant: NoiseTech Microwaves Ltd., Calgary (CA)

(72) Inventors: Michael Raymond Himmelfarb, Calgary (CA); Leonid Belostotski, Calgary (CA)

(73) Assignee: NOISETECH MICROWAVES LTD., Calgary (CA)

( * ) Notice: Subject to any disclaimer, the term of this patent is extended or adjusted under 35 U.S.C. 154(b) by 148 days.

(21) Appl. No.: 15/649,101

(22) Filed: Jul. 13, 2017

(65) Prior Publication Data
US 2018/0024177 A1 Jan. 25, 2018

Related U.S. Application Data

(60) Provisional application No. 62/364,458, filed on Jul. 20, 2016.

(51) Int. Cl.
*G01R 29/26* (2006.01)
(52) U.S. Cl.
CPC .................... *G01R 29/26* (2013.01)
(58) Field of Classification Search
CPC ....................................................... G01R 29/26
See application file for complete search history.

(56) References Cited

U.S. PATENT DOCUMENTS

| 4,998,071 A * | 3/1991 | Strid ............ G01R 29/26 324/612 |
| 5,034,708 A | 7/1991 | Adamian et al. |
| 7,589,601 B2 | 9/2009 | Simpson |

(Continued)

OTHER PUBLICATIONS

Nguyen, et al., "Efficient Noise Extraction Algorithm and Wideband Noise Measurement System from 0.3 GHz to 67 GHz", In 81st Microwave Measurement Conference (ARFTG), 2013, Seattle, Washington, IEEE, 2 pages.

(Continued)

*Primary Examiner* — Noam Reisner
(74) *Attorney, Agent, or Firm* — Bereskin & Parr LLP/S.E.N.C.R.L., s.r.l.; Isis E. Caulder; Reshika Dhir

(57) ABSTRACT

A system and method for measuring noise parameters of a linear device-under-test is provided. The system includes a noise source, an impedance generator, a receiver for measuring noise power of the device-under-test, and a processor and memory. The impedance generator has a plurality of impedance generator settings to generate a plurality of driving-port impedances over a plurality of frequencies. The processor is configured for identifying a plurality of stable driving-port impedances, calculating an aggregate driving-port impedance for each of the stable driving-port impedances, identifying a minimal set of impedance generator settings for a user-selected frequency range, and calculating the noise parameters of the device-under-test based on the noise power measured by the receiver. The minimal set of impedance generator settings provide at least one aggregate driving-port impedance located within each of four linearly independent regions of a Smith Chart over the user-selected frequency range.

18 Claims, 11 Drawing Sheets

(56) References Cited

U.S. PATENT DOCUMENTS

| | | | |
|---|---|---|---|
| 8,212,629 | B1 | 7/2012 | Tsironis |
| 8,786,293 | B1 * | 7/2014 | Tsironis .................. G01R 27/06 |
| | | | 324/613 |
| 8,892,380 | B2 | 11/2014 | Simpson |
| 2008/0238441 | A1 | 10/2008 | Rhymes et al. |
| 2014/0354294 | A1 | 12/2014 | Boudiaf et al. |
| 2015/0073749 | A1 | 3/2015 | Simpson |
| 2016/0124032 | A1 | 5/2016 | Simpson |

OTHER PUBLICATIONS

Edwards, et al., "A New Criterion for Linear 2-Port Stability Using a Single Geometrically Derived Parameter", IEEE Transactions on Microwave Theory and Techniques, 1992, 40(12): 2303-2311.

Belostotski, et al., "Evaluation of Tuner-Based Noise-Parameter Extraction Methods for Very Low Noise Amplifiers", IEEE Transactions on Microwave Theory and Techniques, 2010, 58(1): 236-250.

Dévé, et al., "A Compact Size Reconfigurable 1-3 GHz Impedance Tuner Suitable for RF MEMS Applications", In ICM 2004 Proceedings, The 16th International Conference on Microelectronics, 2004, Tunis, Tunisia, IEEE, pp. 101-104.

Beaulieu, "Wideband MEMS-Based Impedance Tuner for Source-Pull Noise-Measurement", Masters Thesis, Dept. of Electrical and Computer Engineering, The University of Calgary, 2011, Calgary, Alberta, Canada, 199 pages.

Vähä-Heikkilä, "MEMS tuning and matching circuits, and millimeter wave on-wafer measurements", Ph.D. Dissertation, Dept. of Electrical and Communications Engineering, Helsinki University of Technology, 2006, VTT Publications 596, Espoo, Finland, 96 pages.

Davidson, et al., "Accuracy Improvements in Microwave Noise Parameter Measurements", IEEE Transactions on Microwave Theory and Techniques, 1989, 37(12): 1973-1978.

Van Den Bosch, et al., "Improved Impedance-Pattern Generation for Automatic Noise-Parameter Determination", IEEE Transactions on Microwave Theory and Techniques, 1998, 46(11): 1673-1678.

Dominicis, et al., "A Novel Impedance Pattern for Fast Noise Measurements", IEEE Transactions on Instrumentation and Measurement, 2002, 51(3): 560-564.

Himmelfarb, et al., "On Impedance-Pattern Selection for Noise Parameter Measurement", IEEE Transactions on Microwave Theory and Techniques, 2016, 64(1): 258-270.

Pieńkowski, et al., "Broadband Multi-State Electronic Impedance Tuner for On-Wafer Noise Parameter Measurement", In 32nd European Microwave Conference, 2002, IEEE, pp. 1-4.

Sjöblom, et al., "An Adaptive Impedance Tuning CMOS Circuit for ISM 2.4-GHz Band", IEEE Transactions on Circuits and Systems—I: Regular Papers, 2005, 52(6): 1115-1124.

McIntosh, et al., "Novel MMIC Source-Impedance Tuners for On-Wafer Microwave Noise-Parameter Measurements", IEEE Transactions on Microwave Theory and Techniques, 1999, 47(2): 125-131.

Dydyk, "MMIC Reflection Coefficient Synthesizer for On-Wafer Noise Parameter Extraction", in Proc. ARFTG Conf. Digest-Spring, vol. 21, 1992, pp. 26-42.

Marsan, et al., "Tunable Microwave Device: Status and Perspective", In the 3rd International IEEE-NEWCAS Conference, 2005, Quebec City, Quebec, Canada, pp. 279-828.

Lane, "The Determination of Device Noise Parameters", Proceedings of the IEEE, 1969, 57(8): 1461-1462.

Hillbrand, et al., "An Efficient Method for Computer Aided Noise Analysis of Linear Amplifier Networks", IEEE Transactions on Circuits and Systems, 1976, CAS-23(4): 235-238.

Rollett, "Stability and Power-Gain Invariants of Linear Twoports", IRE Transactions on Circuit Theory, 1962, 9(1): 29-32.

* cited by examiner

SYSTEM AND METHOD FOR MEASURING WIDEBAND NOISE PARAMETERS USING AN IMPEDANCE GENERATOR

FIELD

Exemplary embodiments described herein relate to systems and methods for measuring noise parameters of a linear device-under-test (DUT).

BACKGROUND

The measurement of noise parameters of a linear device is of interest to users and designers of such linear devices. In this description, linear devices are considered to be devices whose output is proportional to the input of the device.

Traditionally, the measurement of noise parameters of a linear device involves generating a plurality of driving-port impedances and measuring noise powers of the device-under-test for each of the driving-port impedances. The plurality of driving-port impedances are typically generated by devices, such as impedance tuners and impedance generators.

Impedance tuners are used for a broad range of RF and microwave measurements such as load pulling for power amplifiers, testing input stability of a device, testing output stability of a device, and noise parameter measurements. Various types of impedance tuners exist such as mechanical impedance tuners and electronic impedance tuners. An example of a mechanical impedance tuner is a slide screw tuner. An example of an electronic impedance tuner is an impedance switching tuner. Tuners can be manually operated or automated.

Mechanical impedance tuners can offer advantages such as high resolution, large achievable voltage-standing-wave ratios (VSWRs), and low loss. However, mechanical impedance tuners can take time to vary impedances and do not offer greater repeatability than electronic impedance tuners. Mechanical impedance tuners can be bulky, thus, having limited portability and modularity.

Electronic impedance tuners switch between different passive structures to generate desired impedances. Electronic impedance tuners can be fast as long as their switches are not mechanical. Electronic impedance tuners offer high repeatability.

Since the measurement of noise parameters traditionally involves generating a plurality of driving-port impedances, measuring noise parameters can be time-intensive, in the order of several hours, due to the tuning of the impedance tuner to achieve the desired driving-port impedance and due to long averaging for reduced measurement uncertainty. Furthermore, inconsistencies may be introduced if the desired driving-port impedance is not repeated consistently.

SUMMARY

In accordance with an embodiment, there is provided a method for measuring noise parameters of a linear device-under-test. The method can involve coupling an impedance generator to the device-under-test, identifying a plurality of stable driving-port impedances from the plurality of driving-port impedances, calculating an aggregate driving-port impedance for each of the plurality of stable driving-port impedances to represent a first cascade network at the output of the impedance generator, identifying a minimal set of impedance generator settings for a user-selected frequency range, measuring, at the receiver, aggregate noise power of the device-under-test, and calculating the noise parameters of the device-under-test based on the aggregate noise power and a second cascade network at an output of the first cascade network. The impedance generator can have a plurality of impedance generator settings to generate a plurality of driving-port impedances over a plurality of frequencies when the noise source is applied to the input of the impedance generator. Each of the plurality of stable driving-port impedances can provide a device-under-test that is stable. Each aggregate driving-port impedance can be the difference between the stable driving-port impedance and a pre-determined driving-port impedance of the same impedance generator setting and frequency. The minimal set of impedance generator settings can include four or more impedance generator settings that provide at least one aggregate driving-port impedance being located within each of four linearly independent regions of a Smith Chart over the user-selected frequency range. The aggregate noise power can be measured when the impedance generator generates an aggregate driving-port impedance for each of the minimal set of impedance generator settings over the user-selected frequency range. The noise parameters of the device-under-test can be determined by removing the effect of the second cascade network from the aggregate noise power. Each pair of first cascade network and second cascade network can provide an ideal through circuit.

In some embodiments, the identifying a plurality of stable driving-port impedances from the plurality of driving-port impedances involves calibrating the impedance generator to obtain electrical properties of the impedance generator, the noise source, the device-under-test, and the receiver; determining the plurality of driving-port impedances for each of the plurality of impedance generator settings and each of the plurality of frequencies based on the electrical properties of the impedance generator and the noise source; for each of the plurality of driving-port impedances, determining whether that driving-port impedance provides a device-under-test that is stable or unstable based on the electrical properties of the device-under-test; and identifying each of the driving-port impedances providing a device-under-test that is stable as one of the plurality of stable driving-port impedances.

In some embodiments, the identifying a minimal set of impedance generator settings for a user-selected frequency range involves determining a location for each of the aggregate driving-port impedances within the user-selected frequency range, wherein the location is one of the four linearly independent regions. For each of the four linearly independent regions, if a single impedance generator setting provides an aggregate driving-port impedance located within that linearly independent region for the user-selected frequency range, that single impedance generator setting can be identified as being in a first potential set of minimal impedance generator settings. Otherwise, if at least two impedance generator settings are required for aggregate-port impedances to be located within that linearly independent region for the user-selected frequency range, the at least two impedance generator settings can be identified as being in the first potential set of minimal impedance generator settings. If only four impedance generator settings are identified as being in the first potential set of minimal impedance generator settings, the first potential set of minimal impedance generator settings can be identified as the minimal set of impedance generator settings. If more than four impedance generator settings are identified as being in the first potential set of minimal impedance generator settings, another potential set of minimal impedance generator settings can be identified using a different set of linearly independent regions.

In some embodiments, the measuring, at the receiver, aggregate noise power of the device-under-test involves obtaining a plurality of aggregate noise factors by repeatedly measuring the aggregate noise factor when the impedance generator generates the aggregate driving-port impedance; determining an average aggregate noise factor from the plurality of aggregate noise factors; and using the average aggregate noise factor as the aggregate noise factor measured for that impedance generator setting over the user-selected frequency range.

In some embodiments, the calculating the noise parameters of the device-under-test based on the aggregate noise power and a second cascade network at an output of the first cascade network involves for each of the minimal set of impedance generator settings over the user-selected frequency range, determining an aggregate noise factor based on the aggregate noise power; calculating linearized noise parameters based on the aggregate noise factors and the aggregate driving-port impedances; and calculating the aggregate noise parameters of the device-under-test based on the linearized noise parameters.

In some embodiments, the calculating an aggregate driving-port impedance for each of the plurality of stable driving-port impedances to represent a first cascade network at the output of the impedance generator involves calculating electrical properties of the first cascade network based on the difference between the stable driving-port impedance and the pre-determined driving-port impedance; and calculating electrical properties of the second cascade network based on the electrical properties of the first cascade network. The calculating the noise parameters of the device-under-test based on the aggregate noise power and a second cascade network at an output of the first cascade network can further involve calculating noise parameters of the second cascade network based on the electrical properties of the second cascade network; and obtaining the noise parameters of the device-under-test by de-embedding the noise parameters of the second cascade network from the aggregate noise parameters.

In some embodiments, the impedance generator includes a plurality of controllable networks. The plurality of controllable networks can include at least one of a variable circuit, an impedance network, and a switch for selecting the impedance network. Each of the plurality of impedance generator settings can include a configuration for the plurality of controllable networks.

In some embodiments, the method can further involve reducing uncertainty in the noise parameters by, for each frequency of the user-selected frequency range, identifying another potential set of minimal impedance generator settings if an absolute value of the optimum reflection coefficient for the minimum noise factor of the noise parameters of the device-under-test based on the aggregate noise power for that frequency is greater than a user-selected large reflection coefficient for the minimum noise factor; measuring, at the receiver, second aggregate noise power of the device-under-test; calculating the noise parameters of the device-under-test based on the second aggregate noise power and the second cascade network; and retaining the noise parameters of the device-under-test based on the second aggregate noise power if a difference between the optimum reflection coefficient for the minimum noise factor of the noise parameters of the device-under-test based on the second aggregate noise power and the optimum reflection coefficient for the minimum noise factor of the noise parameters of the device-under-test based on the aggregate noise power is less than a user-selected difference threshold.

In accordance with another embodiment, there is provided a system for measuring noise parameters of a linear device-under-test. The system can include a noise source, an impedance generator, a receiver for measuring noise power of the device-under-test, and a processor and memory. The impedance generator can have a plurality of impedance generator settings to generate a plurality of driving-port impedances over a plurality of frequencies. The processor can be configured for identifying a plurality of stable driving-port impedances from the plurality of driving-port impedances, calculating an aggregate driving-port impedance for each of the plurality of stable driving-port impedances to represent a first cascade network at the output of the impedance generator, identifying a minimal set of impedance generator settings for a user-selected frequency range, providing the minimal set of impedance generator settings to the impedance generator, receiving aggregate noise power measured by the receiver, and calculating the noise parameters of the device-under-test based on the aggregate noise power. The minimal set of impedance generator settings can include four or more aggregate impedance generator settings that provide at least one aggregate driving-port impedance being located within each of four linearly independent regions of a Smith Chart over the user-selected frequency range. The noise parameters of the device-under-test can be calculated by removing the effect of a second cascade network at an output of the first cascade network from the aggregate noise power. Each pair of first cascade network and second cascade network can provide an ideal through circuit.

In various embodiments, the processor is configured to perform the method as defined above or other methods in accordance with the teachings herein.

In accordance with another embodiment, there is provided a non-transitory computer-readable medium storing computer-executable instructions. The instructions can cause the processor to perform the methods as described above or other methods in accordance with the teachings herein.

Further aspects and advantages of the embodiments described herein will appear from the following description taken together with the accompanying drawings.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which.

Figure 1A:
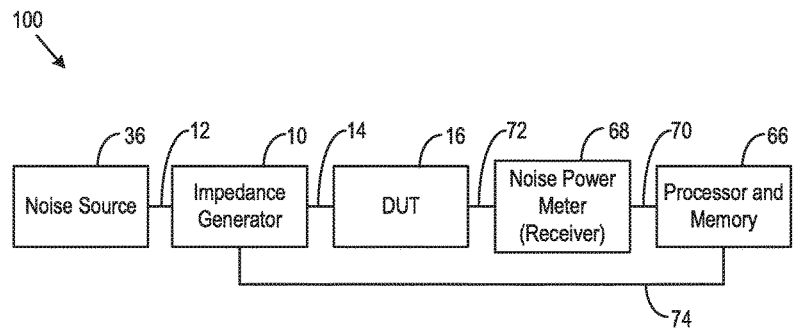
FIG. 1A is schematic diagram of a system for measuring noise parameters of a linear device-under-test, according to at least one embodiment.

The skilled person in the art will understand that the drawings, described below, are for illustration purposes only. The drawings are not intended to limit the scope of the applicants' teachings in anyway. Also, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF VARIOUS EMBODIMENTS

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements.

The embodiments of the systems and methods described herein may be implemented in hardware or software, or a combination of both. However, preferably, these embodiments are implemented in computer programs executing on programmable computers, each comprising at least one processor, a data storage system (including volatile and non-volatile memory and/or storage elements), at least one input device, and at least one output device. For example and without limitation, the programmable computers may be a mainframe computer, server, personal computer, laptop, personal data assistant, cellular telephone, smartphone, or tablet device. Program code is applied to input data to perform the functions described herein and generate output information. The output information is applied to one or more output devices in known fashion.

Each program is preferably implemented in a high level procedural or object oriented programming and/or scripting language to communicate with a computer system. However, the programs can be implemented in assembly or machine language, if desired. In any case, the language may be a compiled or interpreted language. Each such computer program is preferably stored on a storage media or a device (e.g. ROM or magnetic diskette) readable by a general or special purpose programmable computer for configuring and operating the computer when the storage media or device is read by the computer to perform the procedures described herein. The system may also be considered to be implemented as a computer-readable storage medium, configured with a computer program, where the storage medium so configured causes a computer to operate in a specific and predefined manner to perform the functions described herein.

Furthermore, the system, processes and methods of the described embodiments are capable of being distributed in a computer program product comprising a computer readable medium that bears computer-usable instructions for one or more processors. The medium may be provided in various forms including one or more diskettes, compact disks, tapes, chips, wireline transmissions, satellite transmissions, internet transmission or downloadings, magnetic and electronic storage media, digital and analog signals, and the like. The computer-usable instructions may also be in various forms including compiled and non-compiled code.

"Noise parameters" herein refers to a set of parameters that can be used to characterize a "noise factor" of a device. The "noise factor" (F), is a measure of the signal-to-noise degradation due to the noise of the device. Noise parameters include a minimum noise factor of a device ($F_{min}$), an equivalent noise conductance ($G_n$), and a complex optimal source impedance for minimum noise factor ($Z_{opt}$).

It should be noted that the terms "impedances", "admittances", and "reflection coefficients" used herein can be used interchangeably. It is understood that the equivalent noise conductance ($G_n$) can be expressed in terms of an equivalent noise resistance ($R_n$), wherein $R_n = G_n/Z_{opt}^2$. The complex optimal source impedance for minimum noise factor ($Z_{opt}$) can be expressed in terms of an optimum admittance for the minimum noise factor ($Y_{opt}$), wherein $Y_{opt} = Z_{opt}^{-1}$, or an optimum reflection coefficient for the minimum noise factor ($\Gamma_{opt}$). The optimum reflection coefficient for the minimum noise factor ($\Gamma_{opt}$) can be determined by equation (1) below.

$$\Gamma_{opt} = \frac{Z_{opt} - Z_0}{Z_{opt} + Z_0} \quad (1)$$

In equation (1), $Z_0$ is the characteristic impedance of the system for measuring noise parameters.

Furthermore, the equivalent noise resistance ($R_n$) can be represented by a Lange invariant (N) that is determined by either equations (2) or (3) below.

$$N = R_n \times Re\{Y_{opt}\} \quad (2)$$

$$N = G_n \times Re\{Z_{opt}\} \quad (3)$$

In equation (2), $Re\{Y_{opt}\}$ is the real part of the complex optimum admittance for the minimum noise factor ($Y_{opt}$). In equation (3), $Re\{Z_{opt}\}$ is the real part of the complex optimal source impedance for the minimum noise factor ($Z_{opt}$).

With known noise parameters, expressed in terms of a minimum noise factor of a device ($F_{min}$), an equivalent noise conductance ($G_n$), and a complex optimal source impedance for minimum noise factor ($Z_{opt}$), the noise factor (F) can be determined from (4) below.

$$F = F_{min} + \frac{G_n}{Re\{Z_s\}} |Z_{opt} - Z_s|^2 \quad (4)$$

In equation (4), $Z_s$ is the driving-port impedance of an impedance generator 11 used to measure the noise parameters and $Re\{Z_s\}$ is the real part of the driving-port impedance ($Z_s$). It is understood that the driving-port impedance ($Z_s$) of an impedance generator 11 can also be expressed in terms of a driving-port admittance ($Y_s$) of the impedance generator 11, wherein $Y_s = Z_s^{-1}$, or a reflection coefficient ($\Gamma_s$).

The noise factor (F) can also be determined from (5) below, using admittances.

$$F = F_{min} + \frac{R_n}{Re\{Y_s\}} |Y_{opt} - Y_s|^2 \quad (5)$$

In equation (5), $Re\{Y_s\}$ is the real part of the driving-port admittance ($Y_s$).

FIG. 1A is a schematic diagram illustrating a system 100 for measuring noise parameters of a linear device-under-test, according to at least one embodiment. System 100 includes a noise source 36, an impedance generator 10, the device-under-test 16, a noise power meter or a receiver 68, and a processor 66. The input 12 of the impedance generator is connected 12 to the output of the noise source 36. The input of the device-under-test 16 is connected to the output 14 of the impedance generator 10. The input of the receiver 68 is connected to the output of the device-under-test 16. The input of the processor 66 is connected 70 to the output of the receiver 68. The processor 66 is also connected 74 to the impedance generator 10.

The noise source 36 can generate a signal source, which is applied to the impedance generator. The impedance generator 10 can generate a plurality of different impedances at the output of the impedance generator 10. The "driving-port impedance" herein refers to the impedance generated by the impedance generator 10.

The impedance generator 10 can have a plurality of impedance generator settings. Each of the impedance generator settings can result in different driving-port impedance. Furthermore, the driving-port impedance also varies with the frequency. The impedance generator 10 can be controlled by the processor 66 via connection 74.

The device-under-test 16 is generally a device that is being tested. The device-under-test 16 can be considered a circuit that contributes noise and/or amplifies noise received; that is, the noise at the output of the device-under-test 16 is greater than the noise at the input of the device-under test 16.

The receiver 68 measures the noise power output from the device-under-test. The receiver 68 can be a power meter, a spectrum analyzer, a noise figure analyzer, or any other device capable of measuring noise power.

The processor and memory 66 receives the noise power measured by the receiver 68 and the noise signal generated by the noise source to determine the noise factor (F) and/or the noise parameters ($F_{min}$, $G_n$, $Z_{opt}$), or an equivalent thereof.

The description herein is directed to the measurement, or extraction of noise parameters for the device-under-test 16. However, calibration of system 100 is required prior to the measurement of noise parameters for a device-under-test. The calibration of system 100 involves the determination of electrical properties of the noise source 36, the impedance generator 10, the device-under-test 16, and the receiver 68. The determination of electrical properties is typically performed by measurement. Electrical properties can be characterized by scattering parameters (s-parameters), impedance parameters (z-parameters), transmission parameters (ABCD-parameters), admittance parameters (y-parameters), scattering transfer parameters (T-parameters), hybrid parameters (H-parameters), inverse hybrid parameters (g-parameters), input reflection coefficient ($\Gamma$), and any other parameters of an appropriate model for characterizing electrical behavior of a device.

Figure 1B:
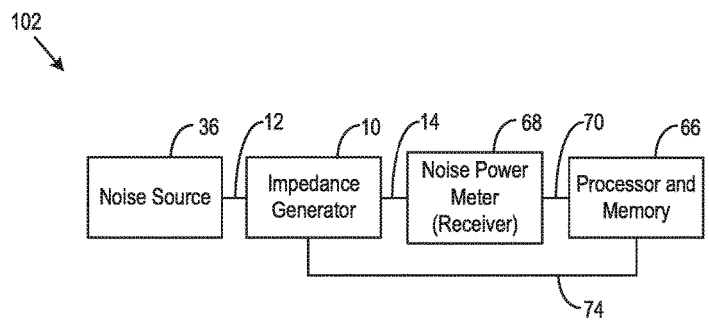
FIG. 1B is a schematic diagram of a system for measuring noise parameters of the receiver during calibration of the system shown in FIG. 1A, according to at least one embodiment.

The calibration of system 100 also involves the determination of noise parameters of the receiver 68. FIG. 1B is a schematic diagram illustrating a system 102 for measuring noise parameters of the receiver 68 during calibration of the system 100, according to at least one embodiment. Similar to system 100, system 102 includes the noise source 36, the impedance generator 10, the receiver 68, and the processor 66. However, system 102 does not include the device-under-test and the input of the receiver 68 is connected 14 to the output of the impedance generator 10. Noise parameters of the receiver 68 can be measured using the same method as that for measuring the noise parameters of the device-under-test 16, described herein.

Figure 1C:
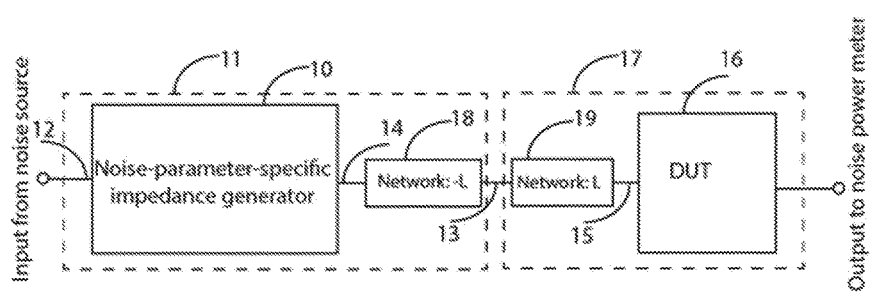
FIG. 1C is a block diagram of the system shown in of FIG. 1A with a first cascade network and a second cascade network, according to at least one embodiment.

FIG. 1C is a block diagram of the system 100 having a first cascade network 18 and a second cascade network 19 along the connection between the output 14 of the impedance generator 10 and the input 15 of the device-under-test 16, according to at least one embodiment. The connection between the output 14 of the impedance generator 10 and the input 15 of the device-under-test 16 can include cables, adapters, bias-Ts, and/or DC blocks.

The first cascade network 18 and the second cascade network 19 are fictitious components between the output 14 of the impedance generator 10 and the input 15 of the device-under-test 16 to represent the actual cables, adapters, bias-Ts, and/or DC blocks along the connection. The first cascade network 18 is connected to the output 14 of the impedance generator 10. The second cascade network 19 is connected to the output 13 of the first cascade network 19. The output of the second cascade network 19 is connected to the input 15 of the device-under-test 16.

The combination of the first cascade network 18 and the second cascade network 19 provide the effect of an ideal short circuit or through circuit. The first cascade network 18 and the second cascade network 19 are provided to model frequency-related shifts to the driving-port impedance along the output 14 of the impedance generator 10 and the input 15 of the device-under-test 16. Frequency-related shifts can occur due to the non-zero length of the connection between the output 14 of the impedance generator 10 and the input 15 of the device-under-test 16. In particular, frequency-related shifts may occur due to the cable, adapters, bias-Ts, and/or DC block along the connection.

As shown in FIG. 1C, the aggregate of the impedance generator 10 and the first cascade network 18 can be represented as a single component, or a redefined impedance generator, or an aggregate impedance generator 11. The aggregate of the second cascade network 19 and the device-under-test 16 can be represented as a single component, or a redefined device-under-test, or an aggregate device-under-test 17. The aggregate impedance generator 11 is connected to the aggregate device-under-test 17 via connection 13.

Figure 2A:
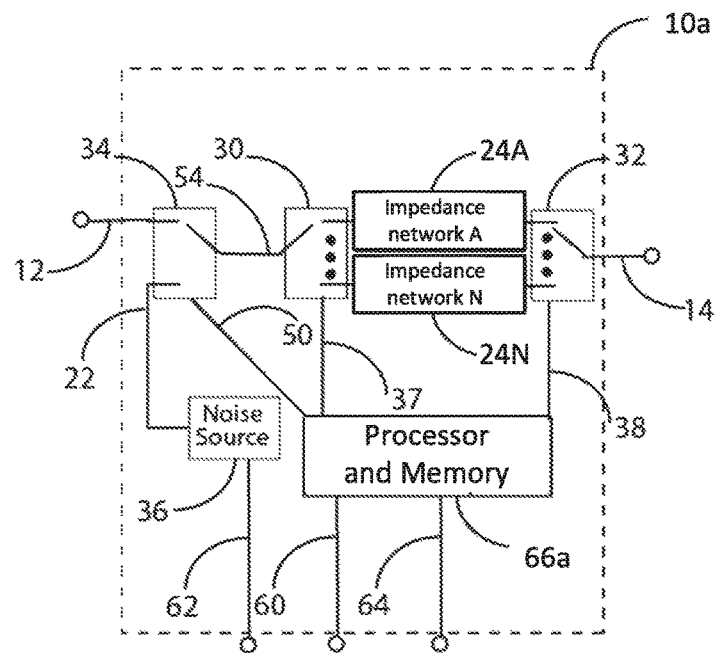
FIG. 2A is a schematic diagram of an impedance generator, according to at least one embodiment.

FIG. 2A is a schematic diagram of an impedance generator 10a, according to at least one embodiment. The impedance generator 10a includes one or more impedance networks A to N (24A to 24N). Each impedance network can include of a network of resistors, inductor, transmission lines and/or capacitors to generate a particular impedance. The impedance generator 10a can also include one or more variable circuits (not shown) having variable parameters to change the impedance of the circuit. An example of a variable circuit is a varactor, which has a tunable capacitance. The impedance generator 10 includes multi-throw switches 30 and 32 to select from amongst impedance networks and/or variable circuits. "Controllable networks" herein refers to networks within the impedance generator that generate various impedances, such as variable circuit, impedance networks, and multi-throw switches. "Impedance generator setting" herein refers to a configuration, or selection of the controllable networks to provide a particular impedance. The provision of controllable networks results in the impedance generator 10a being relatively smaller in size and weight than traditional impedance tuners. The smaller size and weight can allow the impedance generator 10a to be portable.

As shown in FIG. 2A, the impedance generator 10a can include processor and memory 66a, which is similar to the processor and memory 66 of FIG. 1A with the exception that the processor and memory 66 are external to the impedance generator 10. The processor and memory 66a can include bi-directional communication port 60 and output port 64. Bi-directional communication port 60 provides for communication between the processor and memory 66a and an external processor (not shown). Output port 64 allows the processor and memory 66a to provide control signals to an external noise source connected at input port 12.

The processor and memory 66a can be connected to the controllable networks to provide control signals to configure the controllable networks to provide a particular impedance. For example, as shown in FIG. 2A, the processor and memory 66a can be connected 37 and 38 to multi-throw switches 30 and 32.

As shown in FIG. 2A, the impedance generator 10a can include noise source 36. The noise source 36 can be controlled by input port 62. In some embodiments, the noise source 36 can be controlled by the processor and memory 66a (shown as connection 56 in FIG. 2B). In some embodiments, as shown in FIG. 1A, the noise source 36 can be external to the impedance generator 10.

Furthermore, when the impedance generator 10a includes noise source 36, the noise source 36 can be connected 22 to switch 34, which provides a control mechanism for connecting 56 either the noise source to 36 the controllable networks or an external noise source provided at the input port 12 of the impedance generator 10a. The processor and memory 66a can be connected 50 to switch 34 to provide control signals for selecting between the noise source 36 and an external noise source provided at the input port 12.

In some embodiments (not shown), the impedance generator 10a includes noise source 36 without switch 34. That is, the noise source 36 can be directly connected to the controllable networks without a control mechanism such as switch 34 select between the noise source 36 and an external noise source. In such embodiments, the impedance generator 10a does not include input port 12.

The impedance generator 10a corresponds to an impedance generator used in a "Y-factor method", or "hot-cold method". During the calibration of the impedance generator 10a in preparation for Y-factor measuring methods, the reflection coefficient of the noise source 36 is measured and the S-parameters of the impedance generator 10a are characterized for each of the impedance generator settings over the plurality of frequencies of the impedance generator 10a. The S-parameters of the impedance generator and reflection coefficient of the noise source 36 are used to calculate the driving-port impedances of the impedance generator 10a at each impedance generator setting over the plurality of frequencies for the impedance generator.

Figure 2B:
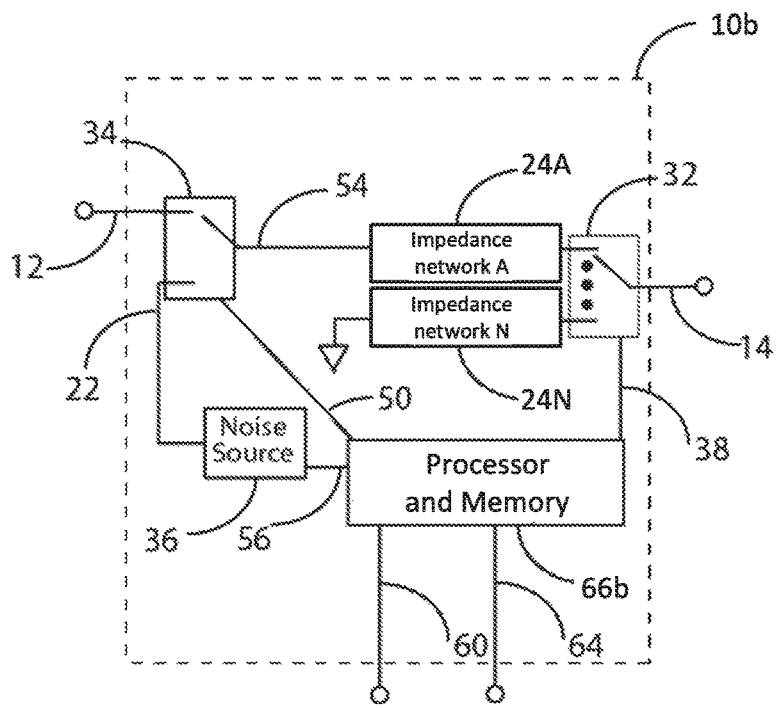
FIG. 2B is a schematic diagram of an impedance generator, according to at least another embodiment.

FIG. 2B is a schematic diagram of an impedance generator 10b, according to at least another embodiment. The impedance generator 10b is similar to that of FIG. 2A with the exception that it does not include multi-port switch 30 for selecting from amongst the controllable networks. As well, the noise source 36 of impedance generator 10b is controlled by the processor and memory 66b via connection 56. Accordingly, the impedance generator 10b does not include input port 62 for noise source 36. In some embodiments, the noise source 36 can have an input port 62 (shown in FIG. 2A) for control by an external processor (not shown).

The impedance generator 10b corresponds to an impedance generator used to measure noise parameters using a "cold method". During the calibration of the impedance generator 10b in preparation for cold method measuring methods, S-parameters of the impedance generator 10b may be measured for only one impedance generator setting and only one driving-port impedance setting at one frequency is calculated. For other settings, the impedance generator 10b does not use the noise source 36 but rather generates impedances on its own. Thus, the noise source 36 of impedance generator 10b is controlled by the processor and memory 66b via connection 56.

Other methods of measuring noise parameters can also be used with impedance generators 10a or 10b, including a combination of the cold method and Y-factor method.

The impedance generators 10a and 10b in FIGS. 2A and 2B do not require impedances to be tuned. Instead, impedance generators 10a and 10b select from a set of fixed impedances using multi-port switches 30 and 32, which offers speed and repeatability. In some embodiments (not shown), impedance tuners such as electro-mechanical impedance tuners and mechanical impedance tuners can be used in place of the impedance generators 10a and 10b. However, impedance tuners requiring tuning do not offer similar speed and repeatability as that of impedance generators which select from a set of fixed impedances.

In some embodiments, the impedance generator 10 can be incorporated within various other circuits or devices, such as a vector network analyzer. For example, the impedance generator 10 can be incorporated in a cryogenic dewar for noise parameter measurements of cryogenic devices-under-test. In another example, the impedance generator 10 can be incorporated as a circuit component on a circuit board and a card for measurements and automation.

Figure 2C:
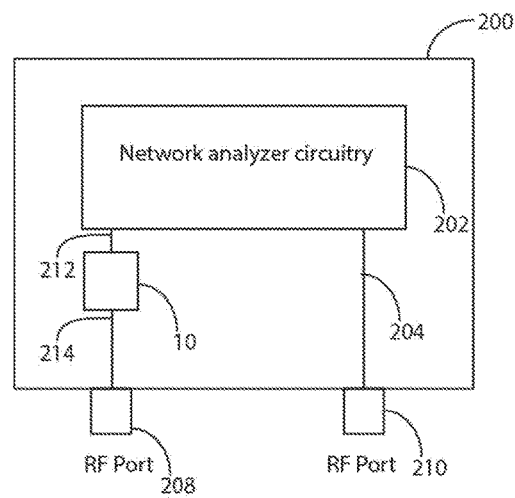
FIG. 2C is a schematic diagram of a two-port vector network analyzer incorporating an impedance generator, according to at least one embodiment, for measuring noise parameters of a linear device-under-test.

FIG. 2C is a schematic diagram of a two-port vector network analyzer 200 incorporating the impedance generator 10, according to at least one embodiment, for measuring noise parameters of a linear device-under-test. The impedance generator 10 can be incorporated in larger measurement equipment, such as the two-port vector network analyzer 200, because of the small size of the impedance generator 10.

Vector network analyzer 200 includes network analyzer circuitry 202 and two radio frequency (RF) ports 208 and 210, each of which is connected to the network analyzer circuitry 202 via connections 212 and 204 respectively. As shown in 200, the impedance generator 10 can be connected to the network analyzer circuitry 202 at RF port 208, via connections 212 and 214. However in other embodiments (not shown), the impedance generator 10 can be connected to the network analyzer circuitry 202 at RF port 210.

Figure 2D:
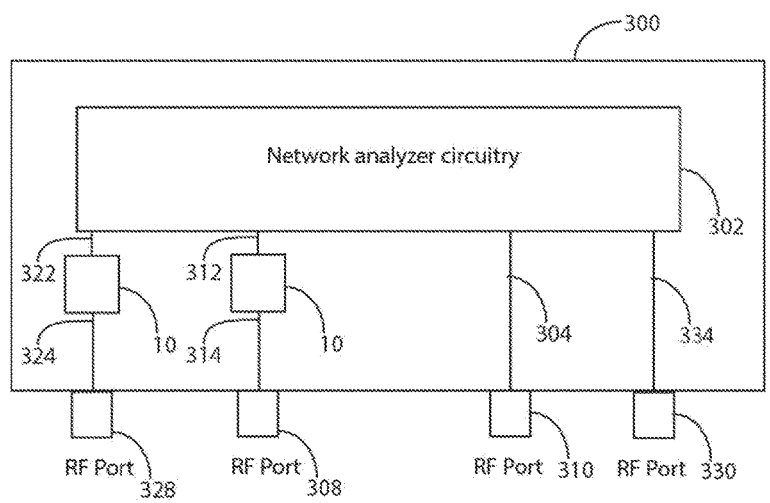
FIG. 2D is a schematic diagram of four-port vector network analyzer incorporating an impedance generator, according to at least one embodiment, for measuring noise parameters of a linear device-under-test.

FIG. 2D is a schematic diagram of a four-port vector network analyzer 300 incorporating the impedance generator 10, according to at least one embodiment, for measuring noise parameters of a linear device-under-test. Again, the small size of impedance generator 10 allows it to be incorporated in larger measurement equipment. Furthermore, an impedance generator 10 incorporated in a four-port vector network analyzer 300 allows for differential noise parameter measurements.

Similar to the two-port vector analyzer 200, vector network analyzer 300 includes network analyzer circuitry 302. However, vector network analyzer 300 includes four RF ports 308, 310, 328, and 330, each of which is connected to the network analyzer circuitry 302 via connections 312, 304, 322, and 334 respectively. As shown in 300, impedance generators 10 can be connected to the network analyzer circuitry 302 at RF ports 308 and 328, via connections 312 and 314 as well as 322 and 324, respectively. Similar to the two-port vector analyzer 200, impedance generators 10 can be connected to the network analyzer circuitry 302 at any one of the RF ports. That is, impedance generators 10 can be connected at RF ports 310 and 330 (not shown).

The impedance generator 10 is configured to provide various driving-port impedances. The driving-port impedances can be illustrated on a Smith Chart by its corresponding reflection coefficient ($\Gamma$). A Smith Chart can be partitioned into different regions, and more specifically, linearly independent regions.

Figure 3A:
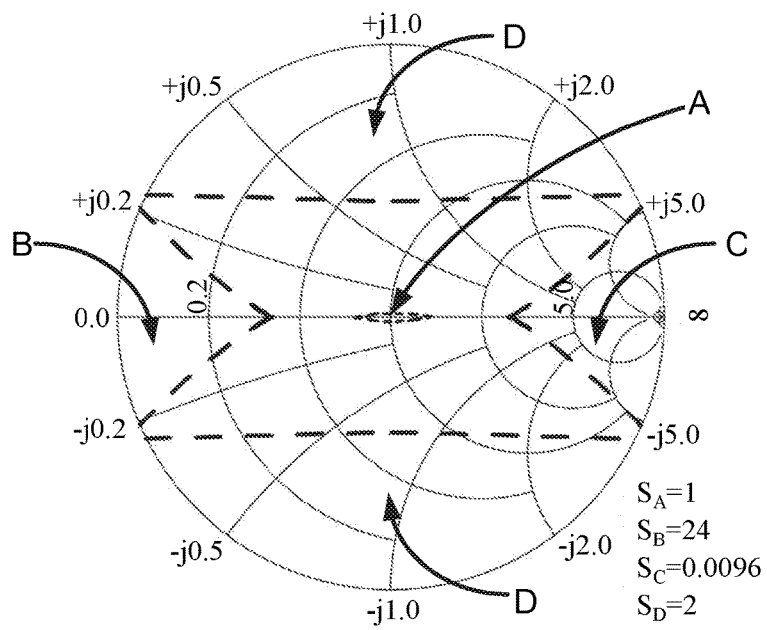
FIG. 3A is a Smith Chart illustrating four linearly independent regions, according to at least one embodiment.

Dashed lines in FIG. 3A illustrate four linearly independent regions A, B, C, and D of the Smith Chart, according to at least one embodiment. Driving-port impedances having reflection coefficients that are located within region B generally lie near a short circuit region of the Smith Chart. That is, the resistive component of a driving-port impedance within region B is very small, or near zero. Driving-port impedances having reflection coefficients that are located within region C generally lie near an open circuit region of the Smith Chart. That is, the resistive component of a driving-port impedance within region B is very large, or approximately infinite. Driving-port impedances having reflection coefficients that are located within region A generally provide an impedance match to the characteristic impedance of the system for measuring noise parameters ($Z_0$). Driving-port impedances having reflection coefficients that are located within region D are generally highly inductive or highly capacitive.

The shape and location of each of the linearly independent regions can be adjusted, or controlled, by a scaling factor ($S_A$ for region A, $S_B$ for region B, $S_C$ for region C, and $S_D$ for region D). The shape and location of the regions are adjustable with scaling factors to accommodate limitations of the impedance generator 10, thus increasing the frequency range of the impedance generator. In FIG. 3A, the scaling factors for regions A, B, C, and D is 1, 24, 0.0096, and 2 respectively.

Figure 3B:
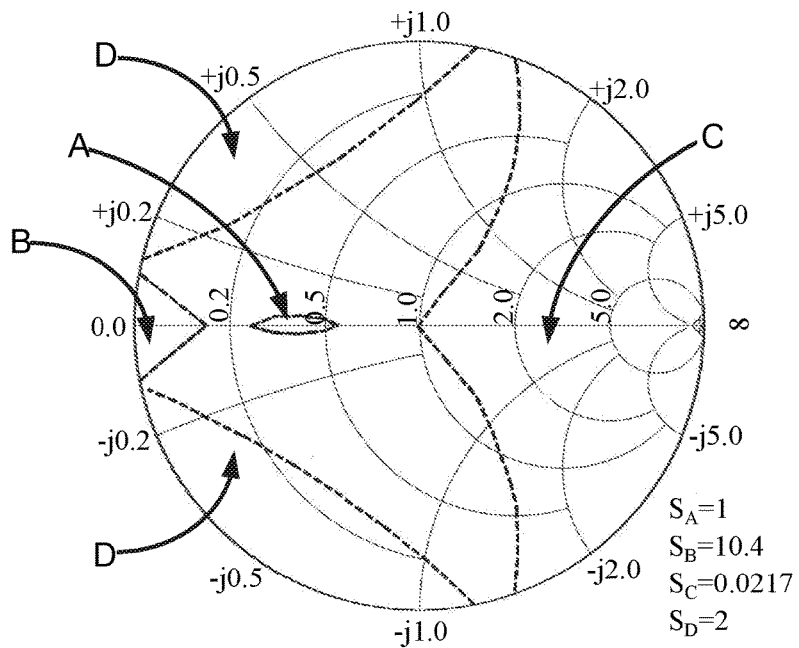
FIG. 3B is a Smith Chart illustrating four linearly independent regions, according to at least another embodiment.

Dashed lines in FIG. 3B illustrate four linearly independent regions A, B, C, and D of the Smith Chart, according to at least another embodiment. In FIG. 3B, the scaling factors for regions A, B, C, and D is 1, 10.4, 0.0217, and 2 respectively. Region B in FIG. 3B is much larger than that of FIG. 3A due to the smaller scaling factor $S_B$. In addition, region C in FIG. 3B is much larger than that of FIG. 3A due to the larger scaling factor $S_C$. The scaling factors for regions A and D in FIG. 3B remain the same as that of FIG. 3A. However, the location of regions A and D are slightly shifted.

Figure 4A:
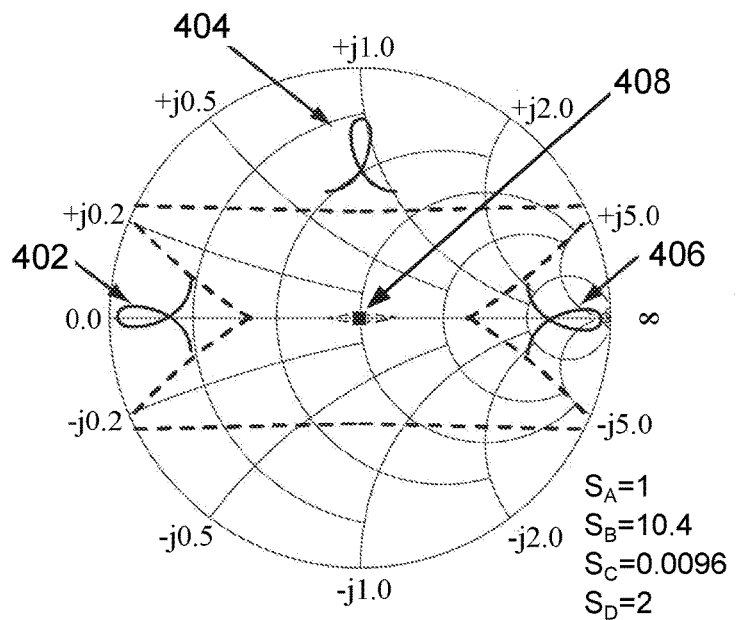
FIG. 4A is a Smith Chart illustrating examples of wideband trajectory of driving-port impedances with respect to the four linearly independent regions of FIG. 3A.
Figure 4B:
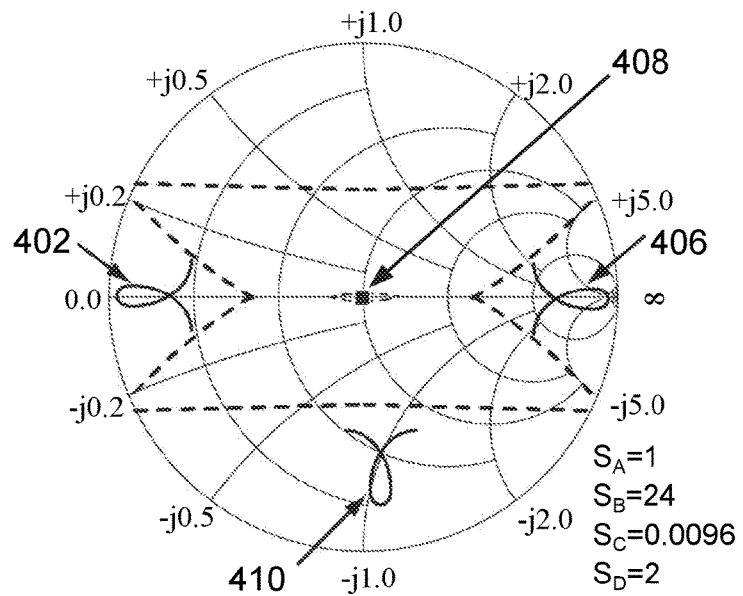
FIG. 4B is a Smith Chart illustrating additional examples of wideband trajectory of driving-port impedances with respect to the four linearly independent regions of FIG. 3A.

Each driving-port impedance is provided at a specific frequency. As the frequency varies, the driving-port impedance varies as well. FIGS. 4A and 4B illustrate examples of reflection coefficient trajectories 402 to 410 for driving-port impedances over a frequency range, or a wide frequency band. As shown in FIGS. 4A and 4B, over the wide frequency band, impedance trajectory 402 remains within region B of the set of four linearly independent regions defined in FIG. 3A. Similarly, over the wide frequency band, impedance trajectory 406 remains within region C of the set of four linearly independent regions defined in FIG. 3A. Over the wide frequency band, impedance trajectories 404 and 410 remain within region D of the set of four linearly independent regions defined in FIG. 3A. The driving-port impedance 408 is predominately resistive and generally, does not have a reactive component that varies with frequency. Accordingly, the impedance trajectory 408 remains within region A of the set of four linearly independent regions defined in FIG. 3A over the wide frequency band.

Figure 5:
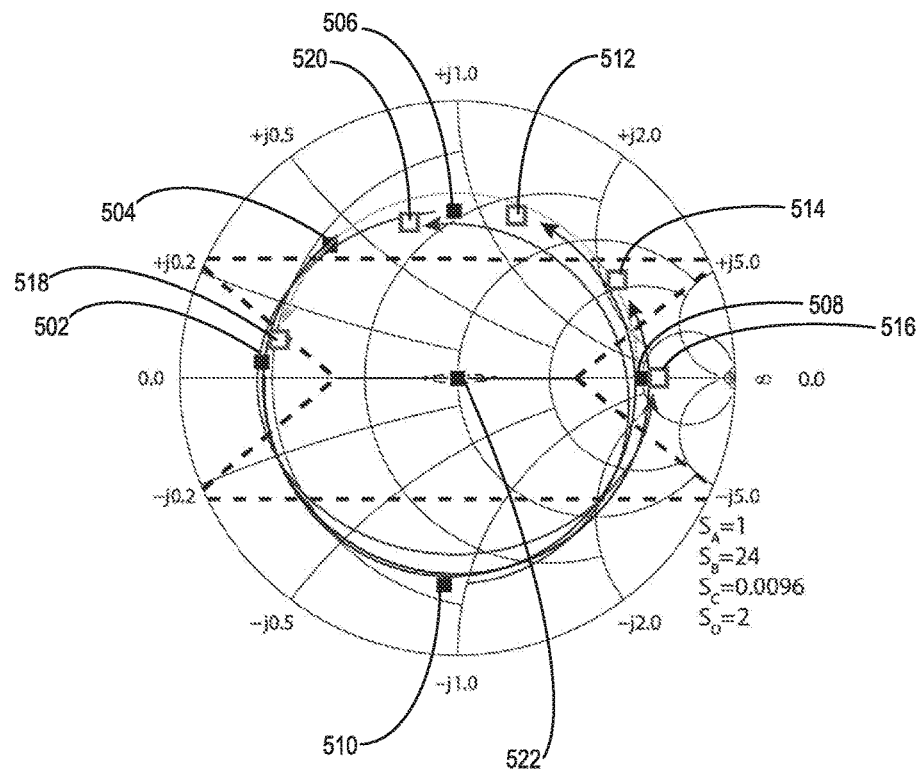
FIG. 5 is a Smith Chart illustrating the trajectory of driving-port impedances generated at different frequencies with respect to the four linearly independent regions of FIG. 3A.

FIG. 5 illustrate another example of reflection coefficient trajectories for driving-port impedances over a wide frequency band. In particular, reflection coefficients 502, 504, 506, 508, and 510, illustrated by solid squares, correspond to driving-port impedances generated at 1 gigahertz (GHz) and reflection coefficients 512, 514, 516, 518, and 520, illustrated by unfilled squares, correspond to driving-port impedances generated at 4 GHz. At 1 GHz, a first impedance generator setting can generate a driving-port impedance having a reflection coefficient 502 located within region B. However, as the frequency increases, the driving-port impedance generated by the same first impedance generator setting moves about the Smith Chart and has a reflection coefficient 512 first that is located within region D.

Similarly, at 1 GHz, a second impedance generator setting can generate a driving-port impedance having a reflection coefficient 506 located within region D. As the frequency increases, the driving-port impedance generated by the same second impedance generator setting moves about the Smith Chart and has a reflection coefficient 516 at 4 GHz that is located within region C. At 1 GHz, a third and fourth impedance generator setting can generate driving-port impedance having reflection coefficients 508 and 510 located within regions C and D, respectively. As the frequency increases, the driving-port impedances generated by the same third and fourth impedance generator settings moves about the Smith Chart and have reflection coefficients 518 and 520 at 4 GHz that are located within region B and D, respectively. Similar to 408, the driving-port impedance 522 is predominately resistive and matched to the characteristic impedance of the system for measuring noise parameters ($Z_0$). Accordingly, the impedance trajectory 522 remains within region A at 1 GHz and 4 GHz.

At 1 GHz, a fourth impedance generator setting can generate a driving-port impedance having a reflection coefficient 504 located within region D. However, as the frequency increases, the driving-port impedance generated by the same fourth impedance generator setting moves about the Smith Chart and has a reflection coefficient 514 at 4 GHz that is not located within any of regions A, B, C, or D.

As set out above, frequency-related shifts can occur due to the non-zero length of the connection 14 between the impedance generator 10 and the device-under-test 16 in FIG. 1A. The first cascade network and the second cascade network are used in the numerical treatment of the noise parameter calculation. The reflection coefficient of a driving-port impedance at the input 15 of the device-under-test 16 is the same as the reflection coefficient at 14 but different from a driving-port impedance at 13, which is the input of the aggregate device-under-test 17 defined as the aggregate of the second cascade network 19 and the device-under-test 16. The driving-port impedance at 13 is the same as the designed reflection coefficient at the output of the impedance generator 10 at output of switch 32 that is before the frequency-related shifts are introduced by connections to the device-under test 16.

Figure 6:
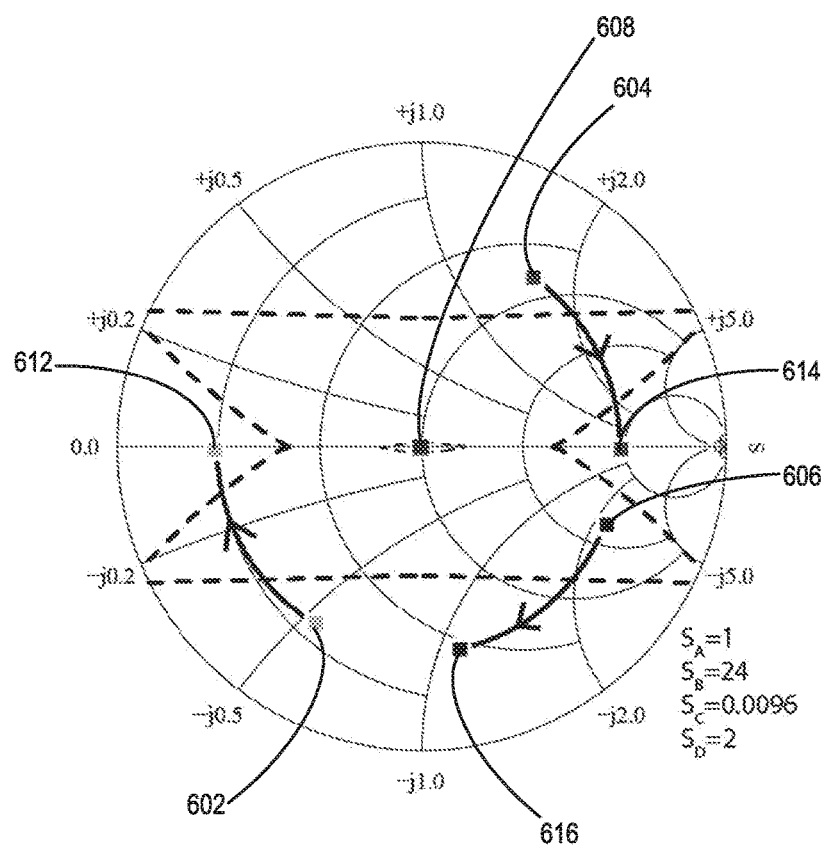
FIG. 6 is a Smith Chart illustrating how the reflection coefficient of an aggregate driving-port impedance can be located within one of the four linearly independent regions of FIG. 3A.

FIG. 6 illustrates examples of the frequency-related shifts in the reflection coefficients 602, 604, and 606 of the driving-port impedance of the device-under-test 16 to reflection coefficients 612, 614, and 616 of the driving-port impedance of the aggregate device-under-test 17, respectively.

At a first impedance generator setting, due to the frequency-related shifts, the driving-port impedance at the input to device-under-test 16 has a reflection coefficient 602 that is located within region D. The first cascade network 18 results in this driving-port impedance undergoing a frequency shift back to the intended location of the driving-port impedance prior to introduction of frequency-related shifts. At the input of the aggregate device-under-test 17, this driving-port impedance has a reflection coefficient 612 which is located within region B.

Similarly, at a second impedance generator setting, the driving-port impedance has a reflection coefficient 614 that is located within region C at the input 13 of the aggregate device-under-test 17 and a reflection coefficient 604 that is located within region D at the input 15 of the device-under-test 16.

At a third impedance generator setting, the driving-port impedance has a reflection coefficient 616 that is located within region D at the input 13 of the aggregate device-under-test 17 and a reflection coefficient 606 that is not located within any one of regions A, B, C, or D at the input 15 of the device-under-test 16.

At a fourth impedance generator setting, the driving-port impedance has a reflection coefficient 608 that is predominately resistive, matched to the characteristic impedance of the system for measuring noise parameters ($Z_0$), and located within region A. Similar to 408 and 522, the driving-port impedance 608 does not have a large reactive component that varies with frequency. Accordingly, the reflection coefficient 608 is nearly the same at the input 13 of the aggregate device-under-test 17 and at the input 15 of the device-under-test 16.

Figure 7:
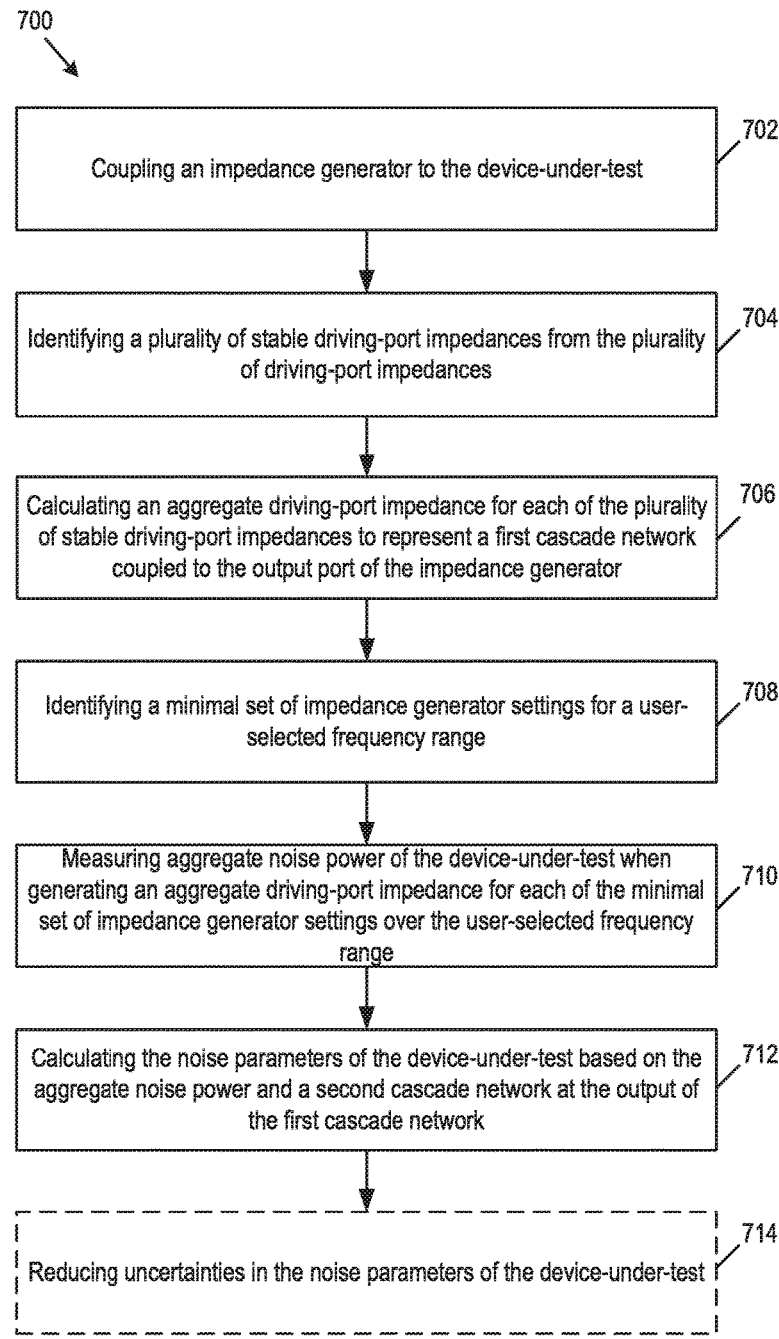
FIG. 7 is a simplified flowchart illustrating a method of measuring noise parameters of a linear device-under-test.

FIG. 7 illustrates a simplified flowchart of a method 700 of measuring noise parameters of a linear device-under-test. The method begins at step 702 by coupling an impedance generator 10 to the device-under-test 16, as shown in system 100 of FIG. 1A. As described above, it is understood that system 100 is calibrated prior to the measurement of noise parameters for the device-under-test 16.

After step 702, the method proceeds to step 704 in which a plurality of stable driving-port impedances are identified from the plurality of driving-port impedances. Step 704 involves first accessing a database, such as the memory coupled to the processor 66, to determine the plurality of driving-port impedances for each of the plurality of impedance generator settings and each of the plurality of frequencies based on the electrical properties of the impedance generator and the noise source.

Having determined the plurality of driving-port impedances, each of the plurality of driving-port impedances are evaluated to determine whether or not they provide a device-under-test 16 that is stable. That is, whether they provide a device-under-test 16 that is stable or unstable. "Stable driving-port impedances" herein refer to driving-port impedances that provide a device-under-test 16 that is stable. Stability of the device-under test 16 can be determined by any method known to a person skilled in the art. For example, stability can be determined based on either the Rollett stability criteria or the µ(S) criteria. The electrical properties of the device-under-test 16 can be required in order to assess the stability of the device-under-test 16. In particular, for the Rollet stability criteria, the S-parameters of the device-under-test and the driving-port impedance can be required.

After step 704, the method proceeds to step 706, in which an aggregate driving-port impedance for each of the plurality of stable driving-port impedances is calculated. "Aggregate driving-port impedance" herein refers to the driving-port impedance of the redefined impedance generator, or an aggregate impedance generator 11 shown in FIG. 1C.

The aggregate driving-port impedance can be determined as being the difference between the stable driving-port impedance, determined at step 704, and a pre-determined driving-port impedance for the impedance generator setting and frequency of the stable driving-port impedance. The pre-determined driving-port impedance can be determined during calibration of the system 100, as set out above in respect of the Y-factor method or during the design of the impedance generator 10.

After step 706, the method proceeds to step 708 in which a minimal set of impedance generator settings for a user-selected frequency range is identified. The minimal set of impedance generator settings includes at least four impedance generator settings. The minimal set of impedance generator settings provide at least one aggregate driving-port impedance having a reflection coefficient that is located within each of the four linearly independent regions of a Smith Chart over the user-selected frequency range. Examples of four linearly independent regions of a Smith Chart are shown in FIGS. 3A and 3B.

By ensuring that at least one aggregate driving-port impedance having a reflection coefficient is located within each of the four linearly independent regions over the user-selected frequency range, the number of impedance generator settings is reduced. By using a minimal number of impedance generator settings, the number of impedance generator settings required of the impedance generator 10 is also reduced. Thus, the complexity of the impedance generator 10 is relatively lower and can avoid the need for impedance tuners that provide a larger range of impedances.

In order to identify a minimal set of impedance generator settings for a user-selected frequency range, step 708 can involve first determining a location of a reflection coefficient for each of the aggregate driving-port impedances within the user-selected frequency range. A user can select the frequency range by providing input to the processor and memory 66.

The determination of a location can be pre-determined for the entire frequency range of the impedance generator and stored in a database. An example database of locations for each driving-port impedance is shown in Table 1 below. As shown in Table 1, the impedance generator has 10 impedance generator settings. For each impedance generator setting, the location of the reflection coefficient for the driving-port impedance generated at that impedance generator setting is identified as being in one of four linearly independent regions, depending on the frequency range indicated by $A_1$ to $A_{10}$, $B_1$ to $B_{10}$, $C_1$ to $C_{10}$, and $D_1$ to $D_{10}$.

TABLE 1

| Impedance Generator Setting | Region A | Region B | Region C | Region D |
|---|---|---|---|---|
| 1 | Range $A_1$ | Range $B_1$ | Range $C_1$ | Range $D_1$ |
| 2 | Range $A_2$ | Range $B_2$ | Range $C_2$ | Range $D_2$ |
| ... | ... | ... | ... | ... |
| 10 | Range $A_{10}$ | Range $B_{10}$ | Range $C_{10}$ | Range $D_{10}$ |

After the location of reflection coefficients for each of the aggregate driving-port impedances within the user-selected frequency range is determined, each of the four linearly independent regions is examined. If the location of a reflection coefficient for an aggregate driving-port impedance is determined to be within that linearly independent region over the user-selected frequency range, then the impedance generator setting for that aggregate driving-port impedance is flagged, or identified as a candidate for the minimal set of impedance generator settings. That is, if the user-selected frequency range is within one of $A_1$ to $A_{10}$, then that corresponding impedance generator setting is selected for region A. For example, if $A_3$ represents the frequency range of 30-70 Hz, and the user-selected frequency range is 40-60 Hz, the third impedance generator setting is identified as a candidate for the minimal set of impedance generator settings. If $B_4$ represents the frequency range of 20-60 Hz, the fourth impedance generator setting is identified as also a candidate for the minimal set of impedance generator settings for region B.

However, if at least two impedance generator settings are required for aggregate-port impedances to be located within that linearly independent region for the user-selected frequency range, then the impedance of at least two impedance generator settings are flagged, or identified as candidates for the minimal set of impedance generator settings. For example, if none of $C_1$ to $C_{10}$ covers the user-selected frequency range is 40-60 Hz, then at least two impedance generator settings may be identified as candidates for the minimal set of impedance generator settings. If $C_1$ represents the frequency range of 20-50 Hz and the $C_2$ represents the frequency range of 45-70 Hz, the first and second impedance generator setting may be identified as a candidate for the minimal set of impedance generator settings for region C.

Preferably, only one impedance generator setting is required to provide an aggregate driving-port impedance within a single linearly independent region over the user-selected frequency range. Accordingly, after examining each of the four linearly independent regions, if only four impedance generator settings are flagged, or identified as being candidates for the minimal set of impedance generator settings, then the candidates are identified as the minimal set of impedance generator settings.

However, if more than four impedance generator settings are flagged, or identified as being candidates for the minimal set of impedance generator settings, then at least one linearly independent region required at least two impedance generator settings for aggregate-port impedances to be located within that linearly independent. In an effort to identify a minimal set of impedance generator settings that include only four impedance generator settings, another set of four linearly independent regions can be considered.

Another set of four linearly independent regions can be identified by applying scaling factors, as shown in FIG. 3B. In some embodiments, an initial set of four linearly independent regions can be similar to that illustrated in FIG. 3A. Additional sets of scaling factor, corresponding to additional sets of four linearly independent regions, can be stored in a database. An example database of scaling factor sets is shown in Table 2 below. As shown in Table 2, the initial set of four linearly independent regions can be similar to that illustrated in FIG. 3A. As well, the scaling factor for region A can be maintained as 1 for all sets of scaling factors to serve as a reference scaling factor.

TABLE 2

| Set No. | $S_A$ | $S_B$ | $S_C$ | $S_D$ |
|---|---|---|---|---|
| 1 | 1 | 24 | 0.0096 | 2 |
| 2 | 1 | 10.4 | 0.00217 | 2.6 |
| 3 | 1 | 55.6 | 0.0037 | 1.48 |

In some embodiments, another set of four linearly independent regions can be identified by locating a different set of scaling factors. A different set of scaling factors can be identified based on the at least one linearly independent region that required at least two impedance generator settings.

Once a second set of four linearly independent regions is identified, the location of a reflection coefficient for each of the aggregate driving-port impedances within the user-selected frequency range is determined again, but this time, with respect to the second set of four linearly independent regions.

Each of the four linearly independent regions of the second set is examined to flag, or identify, another set of candidates for the minimal set of impedance generator settings. Again, if only four impedance generator settings are flagged, or identified as being candidates for the minimal set of impedance generator settings, then that set of candidates are identified as the minimal set of impedance generator settings.

The steps of identifying another four linearly independent regions and corresponding candidates for the minimal set of impedance generator settings can be repeated for each set of scaling factors stored in the database until a preferred minimal set of impedance generator settings is identified. That is, until a candidate set contains only four impedance generator settings which provide an aggregate driving-port impedance within each of the four linearly independent region over the user-selected frequency range.

If all sets of scaling factors stored in the database are exhausted and a minimal set of impedance generator settings comprising only four impedance generator settings was not located, then the minimal set of impedance generator settings can be selected from amongst the candidate sets. Selecting a minimal set of impedance generator settings from amongst candidate sets can be based on which candidate set contains a fewest, or least number of impedance generator settings.

In some embodiments, candidates for the minimal set of impedance generator settings can be subject to additional requirements. For example, in some embodiments, an absolute value of the reflection coefficient for each of the aggregate driving-port impedances within the user-selected frequency range must be less than a pre-determined maximum absolute value for reflection coefficients of aggregate driving-port impedances in order to be flagged, or identified as being a candidate for the minimal set of impedance generator settings. In some embodiments, the user-selected frequency range can have a value of about 0.8.

After step 708, the method proceeds to step 710, wherein the receiver 68 is used to measure an aggregate noise power of the device-under-test. The aggregate noise power of the device-under-test is measured when the impedance generator 10 generates an aggregate driving-port impedance for each of the minimal set of impedance generator settings over the user-selected frequency range.

The receiver 68 measures an aggregate noise power of the device-under-test. "Aggregate noise power of the device-under-test" herein refers to the noise power of the redefined device-under-test, or an aggregate device-under-test 17 shown in FIG. 1C.

It is understood that the noise power measured by the receiver 68 includes a known noise power for the receiver. The known noise power for the receiver is determined in advance, such as during calibration of the system 100. Furthermore, the known noise power of the receiver is removed from the noise power measured by the receiver 68 to provide a noise power measurement that does not include the noise power of the receiver 68.

For greater precision, the noise power can be repeatedly measured for each impedance generator setting. An average of the measurements for a single impedance generator setting can be used as the noise power for that impedance generator setting. In some embodiments, the noise power measurement for a single impedance generator setting can be repeated in the order of about 8 times to about 128 times. Any method of averaging known to a person skilled in the art can be used. The choice of averaging methods can be based on time and desired accuracy. However, longer averages can suffer from systematic drifts, such as temperature drifts, and may not be desirable.

After step 710, the method proceeds to step 712, wherein the noise parameters of the device-under-test 16 are calculated based on the aggregate noise power. As set out above, the aggregate noise power refers to the noise power of the aggregate device-under-test 17, that is, the aggregation of the second cascade network 19 and the device-under-test 16.

Calculating the noise parameters of the device-under-test 16 involves, first, converting each noise power measurement obtained in step 710 to a noise factor. That is, for each of the minimal set of impedance generator settings at each frequency over the user-selected frequency range, determining an aggregate noise factor based on the aggregate noise power. The aggregate noise factor for each frequency is determined equation (6) below.

$$F_{setting, frequency} = \frac{\text{Noise Power}_{setting, frequency}}{GkTB} \quad (6)$$

In equation (6), G is the gain of the device-under-test; k is Boltzmann's constant, T is the absolute temperature, and B is measurement bandwidth of the device-under-test.

Having converted each noise power measurement to an aggregate noise factor, the aggregate noise factor and the aggregate driving-port impedances can be used to calculate linearized noise parameters, which can in turn, be used to calculate aggregate noise parameters.

Linearized noise parameters are used to simplify the determination of noise parameters. As shown in equations (4) and (5), the relationship between the noise factor (F) and the noise parameters are non-linear. Any appropriate method can be used to linearize noise parameters. For example, Lane transformations can be used to linearize noise parameters.

In some embodiments, linearized noise parameters can be a set of parameters (A, B, C, and D). The set of linearized noise parameters (A, B, C, and D) can relate to the noise parameters by equations (7) to (9) below.

$$F_{min} = A + \sqrt{4BC - D^2} \quad (7)$$

$$R_n = B \quad (8)$$

$$Y_{opt} = \frac{\sqrt{4BC - D^2}}{2B} - j\frac{D}{2B} \quad (9)$$

In equation (9), $j=\sqrt{-1}$.

In the preferred case of the minimal set of impedance generator settings having only four impedance generator settings, the linearized noise parameters can be calculated from the aggregate noise factors ($F_1$, $F_2$, $F_3$, $F_4$) and the corresponding aggregate driving-port impedances ($Z_1$, $Z_2$, $Z_3$, $Z_4$) or driving-port admittances ($Y_1$, $Y_2$, $Y_3$, $Y_4$) at which the aggregate noise factors are measured, using the system of equations (10) below.

$$\begin{bmatrix} F_1 \\ F_2 \\ F_3 \\ F_4 \end{bmatrix} = \begin{bmatrix} S_A & S_B\left(G_1 + \frac{B_1^2}{G_1}\right) & \frac{S_C}{G_1} & S_D\frac{B_1}{G_1} \\ S_A & S_B\left(G_2 + \frac{B_2^2}{G_2}\right) & \frac{S_C}{G_2} & S_D\frac{B_2}{G_2} \\ S_A & S_B\left(G_3 + \frac{B_3^2}{G_3}\right) & \frac{S_C}{G_3} & S_D\frac{B_3}{G_3} \\ S_A & S_B\left(G_4 + \frac{B_4^2}{G_4}\right) & \frac{S_C}{G_4} & S_D\frac{B_4}{G_4} \end{bmatrix} \begin{bmatrix} AS_A^{-1} \\ BS_B^{-1} \\ CS_C^{-1} \\ DS_D^{-1} \end{bmatrix} \quad (10)$$

In equation (10), $S_A$, $S_B$, $S_C$, $S_D$ are the scaling factors for the four linearly independent regions; $G_1$, $G_2$, $G_3$, $G_4$ are the real parts of the driving-port admittances; and $B_1$, $B_2$, $B_3$, $B_4$ are the complex parts of the driving-port admittances. That is, the driving-port admittances can be expressed as:

$$Y_1 = G_1 + jB_1, \ Y_2 = G_2 + jB_2, \ Y_3 = G_3 + jB_3, \text{ and } Y_4 = G_4 + jB_4.$$

Having selected impedance generator settings that provide at least one driving-port impedance having a reflection coefficient that is located within each of the four linearly independent regions at step 706 ensures that the 4×4 matrix of equation (10) is well-conditioned and directly solvable. A well-conditioned matrix herein refers to a matrix having diagonal dominance. A matrix has diagonal dominance when, for each element (x) of the matrix, equation (11) is true:

$$|x_{ii}| \geq \Sigma_{j \neq i} |x_{ji}| \qquad (11)$$

After determining linearized noise parameters, the aggregate noise parameters can be determined from equations (7) to (9) above. The aggregate noise parameters include the effect of the second cascade network 19. To determine the noise parameters of the device-under-test 16, step 712 further involves de-embedding, or removing the effect of the second cascade network 19 from the aggregate noise parameter.

The effect of the second cascade network 19 can be characterized by noise parameters of the second cascade network 19. The noise parameters can be determined by the electrical properties of the second cascade network. Determination of noise parameters from electrical properties can be determined by any method known to a person skilled in the art. For example, S-parameters can be used to determine noise correlation matrices and noise correlation matrices can in turn, be used to determine noise parameters.

The electrical properties of the second cascade network 19 can be determined by the electrical properties of the first cascade network 18. As set out above, the combination of the first cascade network 18 and the second cascade network 19 provide an ideal short circuit, or through circuit.

The electrical properties of the first cascade network 18 can be determined based on the difference between the stable driving-port impedance determined in step 704 and the pre-determined driving-port impedance determined during calibration of the system 100 or design of impedance generator 10. In some embodiments, the electrical properties of the first cascade network 18 and/or the electrical properties of the second cascade network 19 can be determined at step 706 along with the determination of the aggregate driving-port impedance.

The use of fictitious cascade networks 18 and 19 can reduce the number of impedance generator settings required to measure broadband noise parameter by accounting for the frequency-related shifts along the connection between impedance generator 10 and the device-under-test 16. The connection between the impedance generator 10 and the device-under-test 16 can cause the driving-port impedances generated by the impedance generator 10 to shift and, at input of the device-under-test, be located outside one of the four linearly independent regions.

In some embodiments, after step 712, uncertainty in the noise parameters of the device-under-test 16 may be further reduced. Uncertainty in the noise parameters of the device-under-test 16 can be assessed by considering the optimum reflection coefficient for the minimum noise factor ($\Gamma_{opt}$). The optimum reflection coefficient for the minimum noise factor ($\Gamma_{opt}$) can be compared with a user-selected large reflection coefficient for the minimum noise factor ($\Gamma_{large\_opt}$). The user can select a large reflection coefficient for the minimum noise factor ($\Gamma_{large\_opt}$) by providing input to the processor and memory 66.

Reducing uncertainty in the measured noise parameters of the device-under-test 16 can be an iterative process. If an absolute value of the measured optimum reflection coefficient for the minimum noise factor ($\Gamma_{opt}$) is less than or equal to the user-selected large reflection coefficient for the minimum noise factor ($\Gamma_{large\_opt}$), the first set of noise parameters of the device-under-test 16 obtained in step 712 can be considered acceptable and the method 700 may terminate.

If the absolute value of the measured optimum reflection coefficient for the minimum noise factor ($\Gamma_{opt}$) is greater than the user-selected large reflection coefficient for the minimum noise factor ($\Gamma_{large\_opt}$), the method 700 can proceed to re-measuring the noise parameters using an alternative set of minimal impedance generator settings.

The alternative set of minimal impedance generator settings can be another set of impedance generator settings for the four linearly independent regions and/or another set of impedance generator settings for another four linearly independent regions of the Smith Chart, herein referred to as "adjusted regions". The adjusted regions can be the initial four linearly independent regions having different scaling factors.

To select an alternative set of minimal impedance generator settings, the reflection coefficients of the driving-port impedances at 13 of the impedance generator settings is examined. Generally, the selection of an alternative set of minimal impedance generator settings can be based the relativity of the reflection coefficients of the driving-port impedances of the impedance generator settings to the optimum reflection coefficient for the minimum noise factor ($\Gamma_{opt}$) obtained in step 712.

In some embodiments, reflection coefficients of the driving-port impedances of the impedance generator settings being about the same as, or close to, the optimum reflection coefficient for the minimum noise factor ($\Gamma_{opt}$) obtained in step 712 is preferred. In some embodiments, the impedance generator settings providing driving-port impedances having reflection coefficients that are closest to the optimum reflection coefficient for the minimum noise factor ($\Gamma_{opt}$) is selected as the alternative set of minimal impedance generator settings. In addition, the alternative set of minimal impedance generator settings, similar to the initial set of minimal impedance generator settings, must provide at least driving-port impedance having a reflection coefficient that is located within each of the four linearly independent regions.

Using the alternative set of minimal impedance generator settings, a second set of noise parameters for the aggregate device-under-test 17 and the device-under-test 16 can be obtained.

If the absolute value of the optimum reflection coefficient for the minimum noise factor ($\Gamma_{opt}$) of the second set of noise parameters is about the same as the absolute value of the optimum reflection coefficient for the minimum noise factor ($\Gamma_{opt}$) of the first set of noise parameters, the second set of noise parameters of the device-under-test 16 can be considered acceptable and the method 700 may terminate.

However, if the absolute value of the optimum reflection coefficient for the minimum noise factor ($\Gamma_{opt}$) of the second set of noise parameters significantly different from the absolute value of the optimum reflection coefficient for the minimum noise factor ($\Gamma_{opt}$) of the first set of the noise parameters, the measurement of noise parameters using another set of minimal impedance generator settings and/or another set of scaling factors can be reiterated to obtain a third set of noise parameters for the device-under-test 16. The noise parameters can be re-measured until the absolute value of the optimum reflection coefficient for the minimum noise factor ($\Gamma_{opt}$) is about the same as the absolute value of the optimum reflection coefficient for the minimum noise factor ($\Gamma_{opt}$) of the previous measurement.

In some embodiments, the method 700 may terminate after a pre-determined number of iterations that do not identify noise parameters of the device-under-test 16 that can be considered acceptable.

Whether the absolute value of the optimum reflection coefficient for the minimum noise factor ($\Gamma_{opt}$) of the second set of noise parameters is significantly different from the absolute value of optimum reflection coefficient for the minimum noise factor ($\Gamma_{opt}$) of the first set of noise parameters can be determined by comparing the absolute value of the optimum reflection coefficient for the minimum noise factor ($\Gamma_{opt}$) of the second set of noise parameters to the absolute value of the optimum reflection coefficient for the minimum noise factor ($\Gamma_{opt}$) of the first set of noise parameters.

If the difference is less than a user-selected difference threshold, the absolute value of the optimum reflection coefficient for the minimum noise factor ($\Gamma_{opt}$) of the second set of noise parameters can be considered to be about the same as the absolute value of the optimum reflection coefficient for the minimum noise factor ($\Gamma_{opt}$) of the first set of noise parameters. If the difference is greater than or equal to a user-selected difference threshold, the absolute value of the optimum reflection coefficient for the minimum noise factor ($\Gamma_{opt}$) of the second set of noise parameters can be considered to be significantly different from the absolute value of the optimum reflection coefficient for the minimum noise factor ($\Gamma_{opt}$) of the first set of noise parameters.

Figure 8A:
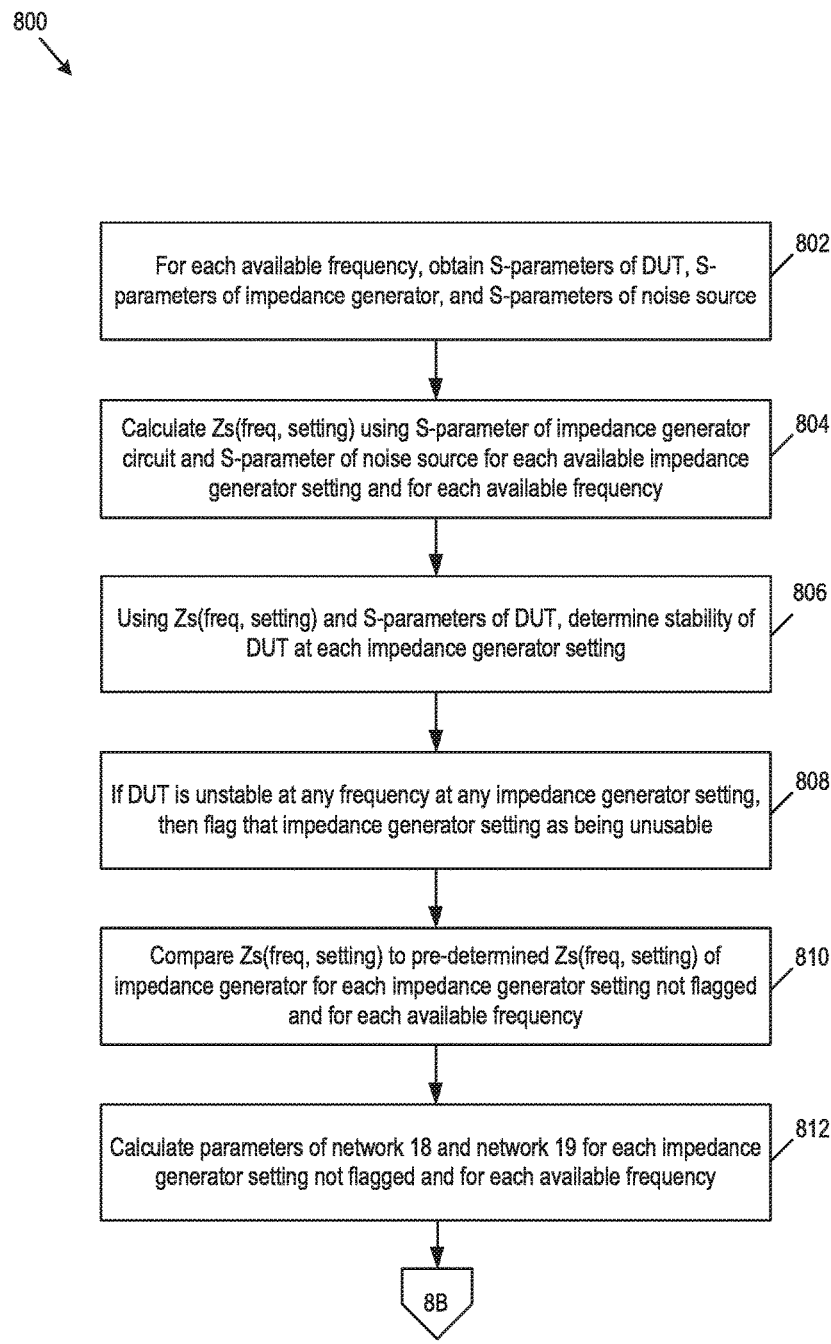
FIG. 8A to 8C is a flowchart illustrating a method of measuring noise parameters of a linear device-under-test.
Figure 8B:
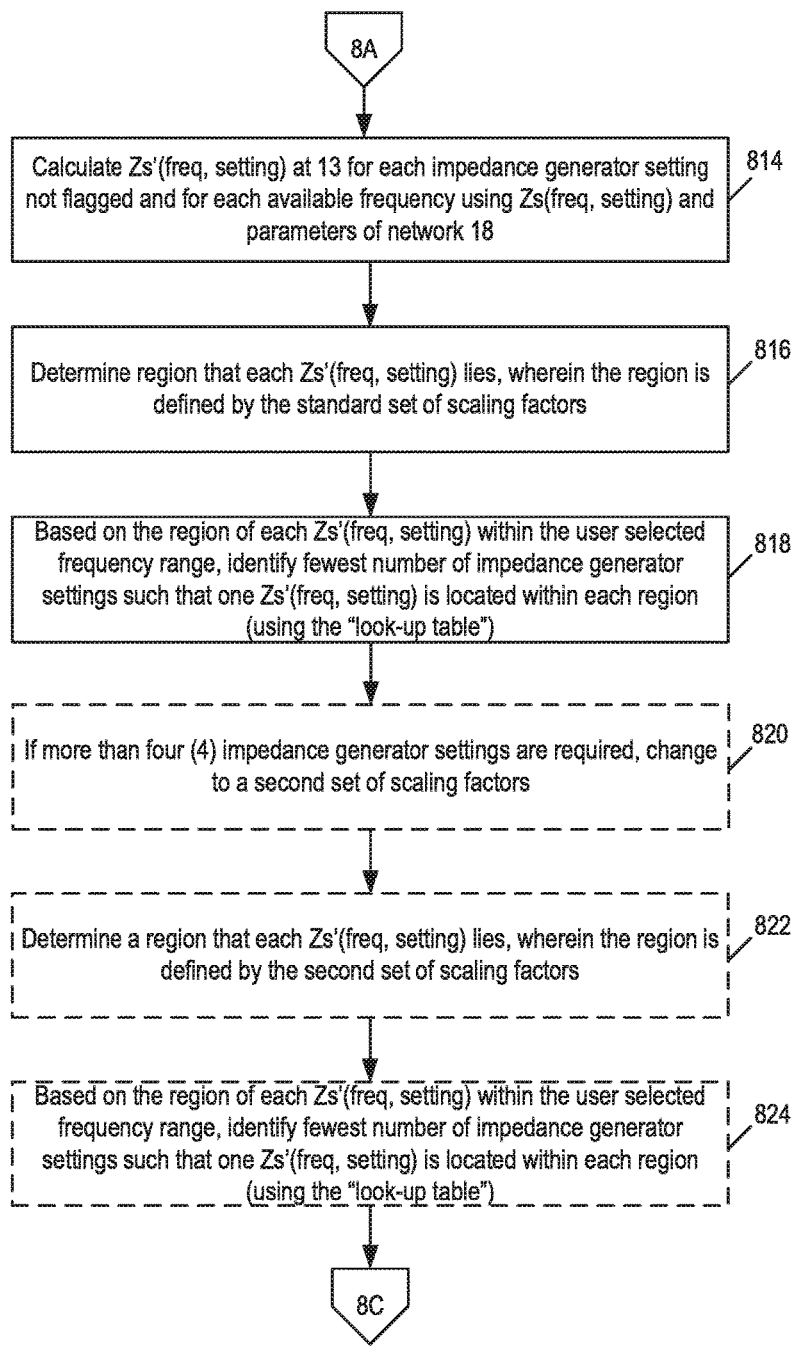
Figure 8C:
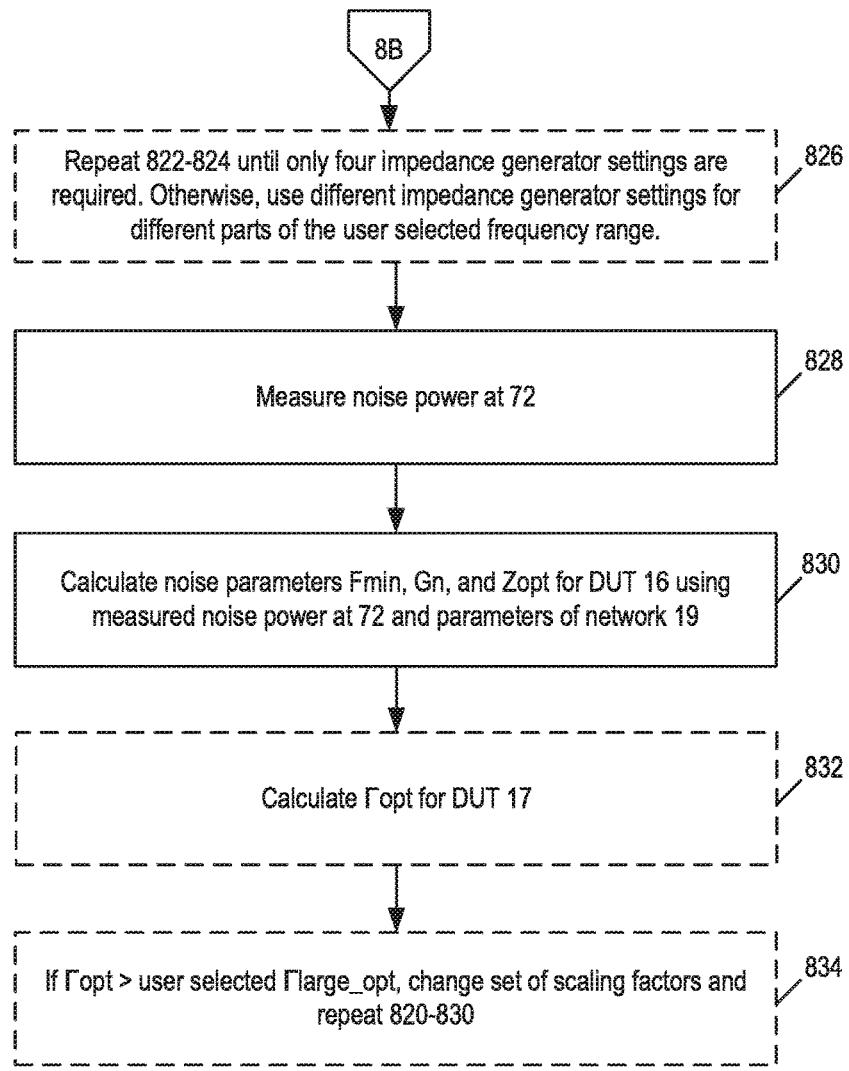

FIG. 8A to 8C is a flowchart illustrating a method 800 of measuring noise parameters of a linear device-under-test. The method 800 begins at step 802, in which electrical properties of the device-under-test 16, the impedance generator 10, and the noise source 36 are obtained. In step 802, scattering parameters (S-parameters) are used to characterize the electrical properties. Referring back to method 700, step 802 may be included in step 704 of method 700.

After step 802, the method proceeds to step 804. At step 804, the driving-port impedance ($Z_s$) for each impedance generator setting and frequency of the impedance generator 10 is calculated. The driving-port impedance ($Z_s$) can be calculated using the electrical properties of the impedance generator 10 and the noise source 36. Referring back to method 700, step 804 may be included in step 704 of method 700.

After step 804, the method proceeds to step 806. At step 806, the stability of the device-under-test at each impedance generator setting is evaluated. The stability of the device-under-test at each impedance generator setting can be determined using the driving-port impedance ($Z_s$) for each impedance generator setting and frequency of the impedance generator 10.

At step 808, the device-under-test is unstable at any frequency at any impedance generator setting, that impedance generator setting is flagged as being unusable. Referring back to method 700, steps 806 and 808 correspond to step 704 of method 700.

For each impedance generator setting that is not flagged as being unusable in step 808, the driving-port impedance ($Z_s$) for each impedance generator setting and frequency of the impedance generator 10 is compared with a pre-determined driving-port impedance ($Z_s$) of the impedance generator of the same impedance generator setting and frequency at step 810. The difference between the driving-port impedance ($Z_s$) and the pre-determined driving-port impedance is used to calculate the parameters of cascade networks 18 and 19 for each impedance generator setting that is not flagged and frequency of the impedance generator 10 at step 812. Referring back to method 700, steps 810 and 812 may be included in step 706 and 712 of method 700.

At step 814, an aggregate driving-port impedance ($Z_s'$) for each impedance generator setting not flagged and frequency of the impedance generator 10 can be calculated. The aggregate driving-port impedance is the driving-port impedance of the impedance generator 10 with frequency-related shifts due to the first cascade network 18. The aggregate driving-port impedance is calculated using the driving-port impedance ($Z_s$) and the parameters of the cascade network 18. Referring back to method 700, step 814 corresponds to step 706 of method 700.

At step 816, the region that each aggregate driving-port impedance ($Z_s'$) lies is determined. The region corresponds to one of four linearly independent region as shown in FIGS. 3A and 3B, which are defined by any set of scaling factors as shown in Table 2. Based on the region of each aggregate driving-port impedance ($Z_s'$) with a user-selected frequency, at step 818, a fewest number of impedance generator settings are identified. The fewest number of impedance generator settings provide at least one aggregate driving-port impedance within each of the four linearly independent regions.

At step 820, the method 800 involves determining whether the fewest number of impedance generator settings include more than four impedance generator settings. If no more than four impedance generator settings are included, the method 800 proceeds to step 828 after step 818. However, if more than four impedance generator settings are included, the method 800 proceeds to step 820 after step 818.

At step 820, a second set of scaling factors is identified. Steps 822 to 826 are similar to steps 816 to 820 with the exception that the regions correspond to one of four linearly independent regions defined the second set of scaling factors. However, if at step 826 it is determined that all of the sets of scaling factors require more than four impedance generator settings to cover the user-selected frequency range, then the set of scaling factors having the fewest number of impedance generator settings that provide at least one aggregate driving-port impedance within each of the four linearly independent regions is used. Referring back to method 700, steps 816 to 826 correspond to step 708 of method 700.

At step 828, the noise power at 72 of FIG. 2A is measured by the receiver 68. Referring back to method 700, step 828 corresponds to step 710 of method 700.

After step 828, the method proceeds to step 830. At step 830, the noise parameters of the device-under-test 16 are calculated. The noise parameters of the device-under-test 16 are calculated using the noise power measured at step 828 and the parameters of network 19 calculated at step 812. Referring back to method 700, step 830 corresponds to step 712 of method 700.

Numerous specific details are set forth herein in order to provide a thorough understanding of the exemplary embodiments described herein. However, it will be understood by those of ordinary skill in the art that these embodiments may be practiced without these specific details. In other instances, well-known methods, procedures and components have not been described in detail so as not to obscure the description of the embodiments. Furthermore, this description is not to be considered as limiting the scope of these embodiments in any way, but rather as merely describing the implementation of these various embodiments.

The invention claimed is:

1. A method for measuring noise parameters of a linear device-under-test, the method comprising:

coupling an impedance generator to the device-under-test, each of the impedance generator and the device-under-test comprising an input and an output, the output of the impedance generator being coupled to the input of the device-under-test, the output of the device-under-test being coupled to a receiver, the impedance generator having a plurality of impedance generator settings to generate a plurality of driving-port impedances over a plurality of frequencies when a noise source is applied to the input of the impedance generator;

identifying a plurality of stable driving-port impedances from the plurality of driving-port impedances, each of the plurality of stable driving-port impedances providing a device-under-test that is stable;

calculating an aggregate driving-port impedance for each of the plurality of stable driving-port impedances to represent a first cascade network at the output of the impedance generator, each aggregate driving-port impedance being based on the difference between the stable driving-port impedance and a pre-determined driving-port impedance, the stable driving-port impedance and the pre-determined driving-port impedance having a common impedance generator setting and a common frequency;

identifying a minimal set of impedance generator settings for a user-selected frequency range, the minimal set of impedance generator settings comprising four or more impedance generator settings that provide at least one aggregate driving-port impedance being located within each of four linearly independent regions of a Smith Chart over the user-selected frequency range, wherein the—identifying a minimal set of impedance generator settings for a user-selected frequency range comprises:

determining a location for each of the aggregate driving-port impedances within the user-selected frequency range, the location comprising one of the four linearly independent regions;

for each of the four linearly independent regions:
if a single impedance generator setting provides an aggregate driving-port impedance located within that linearly independent region for the user-selected frequency range, identifying that single impedance generator setting as being in a first potential set of minimal impedance generator settings;

otherwise, if at least two impedance generator settings are required for aggregate-port impedances to be located within that linearly independent region for the user-selected frequency range, identifying the at least two impedance generator settings as being in the first potential set of minimal impedance generator settings; and if only four impedance generator settings are identified as being in the first potential set of minimal impedance generator settings, identifying the first potential set of minimal impedance generator settings as the minimal set of impedance generator settings;

otherwise:
identifying four adjusted regions of the Smith Chart, the four adjusted regions comprising the four linearly independent regions with scaling factors applied;

determining an adjusted location for each of the aggregate driving-port impedances within the user-selected frequency range, the adjusted location comprising one of the four adjusted regions;

for each of the four adjusted regions:
if a single impedance generator setting provides an aggregate driving-port impedance located within that adjusted region for the user-selected frequency range, identifying that single impedance generator setting as being in a second potential set of minimal impedance generator settings;

otherwise, if at least two impedance generator settings are required for aggregate-port impedances to be located within that adjusted region for the user-selected frequency range, identifying the at least two impedance generator settings as being in the second potential set of minimal impedance generator settings; and if only four impedance generator settings are identified as being in the second potential set of minimal impedance generator settings, identifying the second potential set of minimal impedance generator settings as the minimal set of impedance generator settings;

otherwise, selecting one of the first potential set of minimal impedance generator settings and the second potential set of minimal impedance generator settings that has a least number of impedance generator settings as the minimal set of impedance generator settings;

measuring, at the receiver, aggregate noise power of the device-under-test when the impedance generator generates an aggregate driving-port impedance for each of the minimal set of impedance generator settings over the user-selected frequency range; and calculating the noise parameters of the device-under-test based on the aggregate noise power and a second cascade network at an output of the first cascade network by removing the effect of the second cascade network from the aggregate noise power, each pair of first cascade network and second cascade network providing an ideal through circuit.

2. The method of claim 1, wherein the—identifying a plurality of stable driving-port impedances from the plurality of driving-port impedances comprises:

calibrating the impedance generator to obtain electrical properties of the impedance generator, the noise source, the device-under-test, and the receiver;

determining the plurality of driving-port impedances for each of the plurality of impedance generator settings and each of the plurality of frequencies based on the electrical properties of the impedance generator and the noise source;

for each of the plurality of driving-port impedances, determining whether that driving-port impedance provides a device-under-test that is stable or unstable based on the electrical properties of the device-under-test; and identifying each of the driving-port impedances providing a device-under-test that is stable as one of the plurality of stable driving-port impedances.

3. The method of claim 2, wherein the electrical properties of the impedance generator, the noise source, the device-under-test, and the receiver are selected from the group consisting of scattering parameters (s-parameters), impedance parameters (z-parameters), transmission parameters (ABCD-parameters), admittance parameters (y-parameters), scattering transfer parameters (T-parameters), hybrid parameters (H-parameters), inverse hybrid parameters (g-parameters), and input reflection coefficient ($\Gamma$).

4. The method of claim 1, wherein the identifying four adjusted regions of the Smith Chart comprises:
accessing a database of pre-determined sets of scaling factors, each pre-determined set of scaling factors comprising a pre-determined scaling factor for an associated one of the four linearly independent regions;
selecting one of the pre-determined sets of scaling factors; and
for the pre-determined set of scaling factors selected, applying each scaling factor to the associated linearly independent region to obtain an adjusted region.

5. The method of claim 1, wherein each impedance generator setting of the first potential set of minimal impedance generator settings and the second potential set of minimal impedance generator settings has an absolute value of a reflection coefficient for the aggregate driving-port impedance that is less than a pre-determined maximum absolute value for reflection coefficients of aggregate driving-port impedances.

6. The method of claim 1, wherein the noise parameters of the device-under-test comprise:
a minimum noise factor ($F_{min}$);
at least one of an equivalent noise conductance ($G_n$) and an equivalent noise resistance ($R_n$); and
at least one of a complex optimal source impedance for the minimum noise factor ($Z_{opt}$), an optimum admittance for the minimum noise factor ($Y_{opt}$), and an optimum reflection coefficient for the minimum noise factor ($\Gamma_{opt}$).

7. The method of claim 1, wherein the—measuring, at the receiver, aggregate noise power of the device-under-test comprises:
obtaining a plurality of aggregate noise factors by repeatedly measuring the aggregate noise factor when the impedance generator generates the aggregate driving-port impedance;
determining an average aggregate noise factor from the plurality of aggregate noise factors; and
using the average aggregate noise factor as the aggregate noise factor measured for that impedance generator setting over the user-selected frequency range.

8. The method of claim 1, wherein the—calculating the noise parameters of the device-under-test based on the aggregate noise power and a second cascade network at an output of the first cascade network comprises:
for each of the minimal set of impedance generator settings over the user-selected frequency range, determining an aggregate noise factor based on the aggregate noise power;
calculating linearized noise parameters based on the aggregate noise factors and the aggregate driving-port impedances; and
calculating the aggregate noise parameters of the device-under-test based on the linearized noise parameters.

9. The method of claim 1, further comprising reducing uncertainty in the noise parameters by, for each frequency of the user-selected frequency range, if an absolute value of the optimum reflection coefficient for the minimum noise factor ($\Gamma_{opt}$) of the noise parameters of the device-under-test based on the aggregate noise power for that frequency is greater than a user-selected large reflection coefficient for the minimum noise factor ($\Gamma_{large\_opt}$):
identifying a second minimal set of impedance generator settings for that frequency;
measuring, at the receiver, second aggregate noise power of the device-under-test when the impedance generator generates an aggregate driving-port impedance for each of the second minimal set of impedance generator settings at that frequency;
calculating the noise parameters of the device-under-test based on the second aggregate noise power and the second cascade network by removing the effect of the second cascade network from the second aggregate noise power; and
retaining the noise parameters of the device-under-test based on the second aggregate noise power if a difference between the optimum reflection coefficient for the minimum noise factor ($\Gamma_{opt}$) of the noise parameters of the device-under-test based on the second aggregate noise power and the optimum reflection coefficient for the minimum noise factor ($\Gamma_{opt}$) of the noise parameters of the device-under-test based on the aggregate noise power is less than a user-selected difference threshold.

10. A system for measuring noise parameters of a linear device-under-test, the system comprising:
a noise source for generating a signal;
an impedance generator coupled to the device-under-test; each of the impedance generator and the device-under-test comprising an input and an output, the output of the impedance generator being coupled to the input of the device-under-test, the impedance generator having a plurality of impedance generator settings to generate a plurality of driving-port impedances over a plurality of frequencies when the noise source is applied to the input of the impedance generator;
a receiver coupled to the output of the device-under-test for measuring noise power of the device-under-test; and
a processor and memory coupled to the impedance generator and the receiver, the processor configured for:
identifying a plurality of stable driving-port impedances from the plurality of driving-port impedances, each of the plurality of stable driving-port impedances providing a device-under-test that is stable;
calculating an aggregate driving-port impedance for each of the plurality of stable driving-port impedances to represent a first cascade network at the output of the impedance generator, each aggregate driving-port impedance being based on the difference between the stable driving-port impedance and a pre-determined driving-port impedance, the stable driving-port impedance and the pre-determined driving-port impedance having a common impedance generator setting and a common frequency;
identifying a minimal set of impedance generator settings for a user-selected frequency range, the minimal set of impedance generator settings comprising four or more impedance generator settings that provide at least one aggregate driving-port impedance being located within each of four linearly independent regions of a Smith Chart over the user-selected frequency range, wherein the—identifying a minimal set of impedance generator settings for a user-selected frequency range comprises:
determining a location for each of the aggregate driving-port impedances within the user-selected frequency range, the location comprising one of the four linearly independent regions;
for each of the four linearly independent regions:
if a single impedance generator setting provides an aggregate driving-port impedance located within that linearly independent region for the user-selected frequency range, identifying that single impedance generator setting as being in a first potential set of minimal impedance generator settings;

otherwise, if at least two impedance generator settings are required for aggregate-port impedances to be located within that linearly independent region for the user-selected frequency range, identifying the at least two impedance generator settings as being in the first potential set of minimal impedance generator settings; and if only four impedance generator settings are identified as being in the first potential set of minimal impedance generator settings, identifying the first potential set of minimal impedance generator settings as the minimal set of impedance generator settings;

otherwise:

identifying four adjusted regions of the Smith Chart, the four adjusted regions comprising the four linearly independent regions with scaling factors applied;

determining an adjusted location for each of the aggregate driving-port impedances within the user-selected frequency range, the adjusted location comprising one of the four adjusted regions;

for each of the four adjusted regions:

if a single impedance generator setting provides an aggregate driving-port impedance located within that adjusted region for the user-selected frequency range, identifying that single impedance generator setting as being in a second potential set of minimal impedance generator settings;

otherwise, if at least two impedance generator settings are required for aggregate-port impedances to be located within that adjusted region for the user-selected frequency range, identifying the at least two impedance generator settings as being in the second potential set of minimal impedance generator settings; and if only four impedance generator settings are identified as being in the second potential set of minimal impedance generator settings, identifying the second potential set of minimal impedance generator settings as the minimal set of impedance generator settings; otherwise, selecting one of the first potential set of minimal impedance generator settings and the second potential set of minimal impedance generator settings that has a least number of impedance generator settings as the minimal set of impedance generator settings;

providing the minimal set of impedance generator settings to the impedance generator;

receiving aggregate noise power measured by the receiver when the impedance generator generates a n aggregate driving-port impedance for each of the minimal set of impedance generator settings over the user-selected frequency range; and calculating the noise parameters of the device-under-test based on the aggregate noise power and a second cascade network at an output of the first cascade network by removing the effect of the second cascade network from the aggregate noise power, each pair of first cascade network and second cascade network providing an ideal through circuit.

11. The system of claim 10, wherein the—identifying a plurality of stable driving-port impedances from the plurality of driving-port impedances comprises:

calibrating the impedance generator to obtain electrical properties of the impedance generator, the noise source, the device-under-test, and the receiver;

determining the plurality of driving-port impedances for each of the plurality of impedance generator settings and each of the plurality of frequencies based on the electrical properties of the impedance generator and the noise source;

for each of the plurality of driving-port impedances, determining whether that driving-port impedance provides a device-under-test that is stable or unstable based on the electrical properties of the device-under-test; and identifying each of the driving-port impedances providing a device-under-test that is stable as one of the plurality of stable driving-port impedances.

12. The system of claim 11, wherein the electrical properties of the impedance generator, the noise source, the device-under-test, and the receiver are selected from the group consisting of scattering parameters (s-parameters), impedance parameters (z-parameters), transmission parameters (ABCD-parameters), admittance parameters (y-parameters), scattering transfer parameters (T-parameters), hybrid parameters (H-parameters), inverse hybrid parameters (g-parameters), and input reflection coefficient ($\Gamma$).

13. The system of claim 10, wherein the identifying four adjusted regions of the Smith Chart comprises:

a) accessing a database of pre-determined sets of scaling factors, each pre-determined set of scaling factors comprising a pre-determined scaling factor for an associated one of the four linearly independent regions;

b) selecting one of the pre-determined sets of scaling factors; and c) for the pre-determined set of scaling factors selected, applying each scaling factor to the associated linearly independent region to obtain an adjusted region.

14. The system of claim 10, wherein each impedance generator setting of the first potential set of minimal impedance generator settings and the second potential set of minimal impedance generator settings has an absolute value of a reflection coefficient for the aggregate driving-port impedance that is less than a pre-determined maximum absolute value for reflection coefficients of aggregate driving-port impedances.

15. The system of claim 10, wherein the noise parameters of the device-under-test comprise:

a minimum noise factor ($F_{min}$);

at least one of an equivalent noise conductance ($G_n$) and an equivalent noise resistance ($R_n$); and at least one of a complex optimal source impedance for the minimum noise factor ($Z_{opt}$), an optimum admittance for the minimum noise factor ($Y_{opt}$), and an optimum reflection coefficient for the minimum noise factor ($\Gamma_{opt}$).

16. The system of claim 10, wherein the—receiving aggregate noise power measured by the receiver comprises:

receiving a plurality of aggregate noise factors when the impedance generator generates the aggregate driving-port impedance;

determining an average aggregate noise factor from the plurality of aggregate noise factors; and using the average aggregate noise factor as the aggregate noise factor measured for that impedance generator setting over the user-selected frequency range.

17. The system of claim 10, wherein the—calculating the noise parameters of the device-under-test based on the aggregate noise power and a second cascade network at an output of the first cascade network comprises:
- for each of the minimal set of impedance generator settings over the user-selected frequency range, determining an aggregate noise factor based on the aggregate noise power;
- calculating linearized noise parameters based on the aggregate noise factors and the aggregate driving-port impedances; and
- calculating the aggregate noise parameters of the device-under-test based on the linearized noise parameters.

18. The system of claim 10, wherein the processor is further configured for reducing uncertainty in the noise parameters by, for each frequency of the user-selected frequency range, if an absolute value of the optimum reflection coefficient for the minimum noise factor ($\Gamma_{opt}$) of the noise parameters of the device-under-test based on the aggregate noise power for that frequency is greater than an a user-selected large reflection coefficient for the minimum noise factor ($\Gamma_{large\_opt}$):
- identifying a second minimal set of impedance generator settings for that frequency;
- providing the second minimal set of impedance generator settings to the impedance generator;
- receiving a second aggregate noise power measured by the receiver when the impedance generator generates an aggregate driving-port impedance for each of the second minimal set of impedance generator settings at that frequency;
- calculating a second set of noise parameters of the device-under-test based on the second aggregate noise power measured by the receiver and the second cascade network by removing the effect of the second cascade network from the second aggregate noise power measured by the receiver; and
- retaining the second set of noise parameters of the device-under-test as the noise parameters of the device-under-test if a difference between the optimum reflection coefficient for the minimum noise factor ($\Gamma_{opt}$) of the second set of noise parameters and the optimum reflection coefficient for the minimum noise factor ($\Gamma_{opt}$) of the first set of noise parameters is less than a user-selected difference threshold.

* * * * *